(12) United States Patent
Kato

(10) Patent No.: US 8,274,638 B2
(45) Date of Patent: Sep. 25, 2012

(54) REFLECTIVE, REFRACTIVE AND PROJECTING OPTICAL SYSTEM; REFLECTIVE, REFRACTIVE AND PROJECTING DEVICE; SCANNING EXPOSURE DEVICE; AND METHOD OF MANUFACTURING MICRO DEVICE

(75) Inventor: Masaki Kato, Yokohama (JP)

(73) Assignee: Nikon Corporation, Tokyo (JP)

( * ) Notice: Subject to any disclaimer, the term of this patent is extended or adjusted under 35 U.S.C. 154(b) by 538 days.

(21) Appl. No.: 12/201,972

(22) Filed: Aug. 29, 2008

(65) Prior Publication Data

US 2009/0009735 A1 Jan. 8, 2009

Related U.S. Application Data

(63) Continuation of application No. PCT/JP2007/053382, filed on Feb. 23, 2007.

(30) Foreign Application Priority Data

Mar. 20, 2006 (JP) ................................. 2006-076011
Jan. 16, 2007 (JP) ................................. 2007-006655

(51) Int. Cl.
*G03B 27/42* (2006.01)

(52) U.S. Cl. ......................................................... 355/53

(58) Field of Classification Search ................... 355/53, 355/46, 67; 359/205, 727, 364
See application file for complete search history.

(56) References Cited

U.S. PATENT DOCUMENTS 6,512,573 B2 1/2003 Furter
(Continued)

FOREIGN PATENT DOCUMENTS

JP A-11-265848 9/1999
(Continued)

OTHER PUBLICATIONS

Chinese Office Action dated Jun. 2, 2010 in Chinese Patent Applicatbn No. 200780009672.7 (with translation).

(Continued)

*Primary Examiner* — Toan Ton
*Assistant Examiner* — Deoram Persaud
(74) *Attorney, Agent, or Firm* — Oliff & Berridge, PLC

(57) ABSTRACT

A scanning exposure apparatus of the present invention is one for transferring a pattern of a first object onto a second object while projecting an image of the first object placed on a first plane, onto the second object placed on a second plane and changing a positional relation between the image of the first object and the second object in a scanning direction. The scanning exposure apparatus has a first projection optical system having a first field of view on the first plane and adapted to project an enlargement image of a portion of the first object in a first projection region on the second plane, based on light from the first field of view, and a second projection optical system having a second field of view on the first plane and adapted to project an enlargement image of a portion of the first object in a second projection region on the second plane, based on light from the second field of view. The scanning exposure apparatus satisfies the relation of $Dp=\beta \times Dm$, where $Dm$ is a first interval being an interval along the scanning direction on the first plane between the first field of view and the second field of view, $Dp$ is a second interval being an interval along the scanning direction on the second plane between the first projection region and the second projection region, and $\beta$ is a magnification of the first and second projection optical systems.

21 Claims, 16 Drawing Sheets

U.S. PATENT DOCUMENTS

2002/0039180 A1    4/2002   Furter
2003/0227607 A1*   12/2003   Kato et al. .................... 355/53

FOREIGN PATENT DOCUMENTS

| JP | A-2001-166497 | 6/2001 |
| JP | A-2001-305747 | 11/2001 |
| JP | A-2003-84445 | 3/2003 |

OTHER PUBLICATIONS

Office Action dated Mar. 13, 2012 issued in Japanese Patent Application No. 2008-510747 (with translation).

Office Action dated May 3, 2012 issued in Chinese Patent Application No. 201110163295.0 (with translation).

* cited by examiner

REFLECTIVE, REFRACTIVE AND PROJECTING OPTICAL SYSTEM; REFLECTIVE, REFRACTIVE AND PROJECTING DEVICE; SCANNING EXPOSURE DEVICE; AND METHOD OF MANUFACTURING MICRO DEVICE

CROSS-REFERENCE TO RELATED APPLICATIONS

This is a continuation application of a PCT application No. PCT/JP2007/053382 filed on Feb. 23, 2007, claiming the benefit of priorities from Japanese Patent application No. 2006-076011 filed on Mar. 20, 2006 and Japanese Patent application No. 2007-006655 filed on Jan. 16, 2007, and incorporated by reference in their entirety.

TECHNICAL FIELD

The present invention relates to a catadioptric projection optical system and catadioptric optical apparatus for projecting an image of a first object (mask, reticle, or the like) onto a second object (substrate or the like), a scanning exposure-apparatus for projecting an image of a first object onto a second object to effect exposure thereof, and a microdevice manufacturing method using the scanning exposure apparatus.

BACKGROUND ART

For example, semiconductor devices, liquid-crystal display devices, or the like are manufactured using a projection exposure apparatus for projecting a pattern of a mask (reticle, photo-mask, or the like) through a projection optical system onto a plate (glass plate, semiconductor wafer, or the like) coated with a resist. The conventional projection exposure apparatus frequently used was one (stepper) for implementing one-shot exposure of a pattern of a reticle in each of shot areas on a plate by the step-and-repeat method. Recently suggested is the projection exposure apparatus of the step-and-scan method having a plurality of small partial projection optical systems with a magnification of 1× arranged in two or more rows at a predetermined interval along a scanning direction, instead of one large projection optical system, and adapted to project patterns of a mask onto a plate through the respective partial projection optical systems to effect exposure thereof, while scanning the mask and the plate relative thereto.

The plate is increasing its size in recent years and the plate over 2 m×2 m has been used. When the above-described exposure apparatus of the step-and-scan method is used to implement exposure on the large-size plate, the mask also has a large size because the partial projection optical systems have the magnification of 1×. The larger the size, the higher the cost of the mask becomes because it is also necessary to maintain flatness of a mask substrate. In addition, since masks for four to five layers are needed to form an ordinary TFT part, considerable cost was required. Therefore, the projection exposure apparatus proposed is one wherein the magnification of the projection optical systems is set to an enlargement magnification, thereby decreasing the size of the mask (Japanese Patent Application Laid-open No. 11-265848).

DISCLOSURE OF THE INVENTION

In the above-described projection exposure apparatus, the optical axes of the projection optical systems on the mask were arranged substantially at the same positions as the optical axes on the plate. Therefore, the apparatus had the problem that patterns scanned and exposed on the plate by the projection optical systems in different rows failed to be joined.

Furthermore, in order to increase exposure regions by the projection optical systems of the above-described projection exposure apparatus, it is necessary to increase the sizes of the lenses forming the projection optical systems. However, the increase in the sizes of the lenses is highly likely to cause deformation asymmetric with respect to the optical axis in a lens holding state or deformation asymmetric with respect to the optical axis in the lenses themselves because of gravity.

An object of the present invention is to implement good pattern transfer in forming an enlargement image of a pattern of a mask on an object such as a plate, by a scanning exposure method using a plurality of projection optical systems. Another object of the present invention is to implement good pattern transfer without occurrence of the axially asymmetric deformation in lenses.

A first aspect of the present invention provides a scanning exposure apparatus for transferring a pattern of a first object onto a second object while projecting an image of the first object placed on a first plane, onto the second object placed on a second plane and changing a positional relation between the image of the first object and the second object in a scanning direction, the scanning exposure apparatus comprising: a first projection optical system having a first field of view on the first plane and adapted to project an enlargement image of a portion of the first object in a first projection region on the second plane, based on light from the first field of view; and a second projection optical system having a second field of view on the first plane and adapted to project an enlargement image of another portion of the first object in a second projection region on the second plane, based on light from the second field of view; wherein the first projection optical system comprises a first beam shifter for shifting the light from the first field of view so as to travel along a first direction intersecting with an axis direction connecting the first plane and the second plane, and guiding the light to the first projection region located as shifted relative to the first field of view in the first direction when viewed from the axis direction; wherein the second projection optical system comprises a second beam shifter for shifting light from the second field of view so as to travel along a second direction opposite to the first direction, and guiding the light to the second projection region located as shifted relative to the second field of view in the second direction when viewed from the axis direction; the scanning exposure apparatus satisfying the following relation:

$$Dp = \beta \times Dm,$$

where Dm is a first interval being an interval along the scanning direction on the first plane between the first field of view and the second field of view, Dp is a second interval being an interval along the scanning direction on the second plane between the first projection region and the second projection region, and $\beta$ is a magnification of the first and second projection optical systems.

A second aspect of the present invention provides a scanning exposure apparatus for transferring a pattern of a first object onto a second object while projecting an image of the first object onto the second object and changing a positional relation between the image of the first object and the second object in a scanning direction, the scanning exposure apparatus comprising: a first row of projection optical systems consisting of a plurality of projection optical systems each having a field of view on a first row along a non-scanning direction being a direction crossing the scanning direction; and a second row of projection optical systems consisting of a plurality of projection optical systems each having a field of view on a second row being a row along the non-scanning direction and different from the first row; wherein the first row of projection optical systems form a plurality of projection regions conjugate with the plurality of field of views of the first row of projection optical systems, on a third row on the second plane; wherein the second row of projection optical systems form a plurality of projection regions conjugate with the plurality of field of views of the second row of projection optical systems, on a fourth row on the second plane; the scanning exposure apparatus satisfying the following relation:

$$Dp = \beta \times Dm,$$

where Dm is a first interval being an interval along the scanning direction on the first plane between the first row and the second row, Dp is a second interval being an interval along the scanning direction on the second plane between the third row and the fourth row, and β is a magnification of the first and second projection optical systems.

A third aspect of the present invention provides a catadioptric projection optical system for forming an image of a first object placed on a first plane, at a projection magnification with an enlargement on a second object placed on a second plane, the projection optical system comprising: a concave reflecting mirror disposed in an optical path between the first plane and the second plane; a first lens unit disposed in an optical path between the first plane and the concave reflecting mirror; a second lens unit disposed in an optical path between the first lens unit and the concave reflecting mirror; a first deflecting member disposed in an optical path between the second lens unit and the second plane and adapted to deflect light so as to traverse an optical axis of the first lens unit; a second deflecting member disposed in an optical path between the first deflecting member and the second plane; and a third lens unit disposed in an optical path between the second deflecting member and the second plane and having an optical axis substantially parallel to the optical axis of the first lens unit.

A fourth aspect of the present invention provides a catadioptric projection optical system for forming an image of a first object placed on a first plane, at a projection magnification with an enlargement on a second object placed on a second plane, the projection optical system comprising: a concave reflecting mirror disposed in an optical path between the first plane and the second plane; a plurality of lenses disposed in the optical path between the first plane and the second plane; and an optical property adjusting mechanism disposed between a position of a pupil of the catadioptric projection optical system and the second plane.

A fifth aspect of the present invention provides a catadioptric optical apparatus comprising a first imaging optical system for forming an intermediate image of the first plane, and a second imaging optical system for making the intermediate image optically conjugate with the second plane, wherein at least one of the first imaging optical system and the second imaging optical system is comprised of the catadioptric projection optical system of the present invention.

A sixth aspect of the present invention provides a scanning exposure apparatus for transferring a pattern of a first object onto a second object while changing a positional relation of the first object and the second object with a projection apparatus for projecting an image of the first object onto the second object, in a scanning direction, wherein the projection apparatus comprises a first projection optical apparatus positioned at a first position in the scanning direction, and a second projection optical apparatus positioned at a second position different from the first position in the scanning direction; wherein the first and second projection optical apparatus comprise the catadioptric projection optical system or the catadioptric optical apparatus of the present invention.

A seventh aspect of the present invention provides a microdevice manufacturing method comprising: an exposure step of effecting exposure of a pattern of a mask on a photosensitive substrate, using the scanning exposure apparatus of the present invention; and a development step of developing the photosensitive substrate exposed in the exposure step.

BEST MODES FOR CARRYING OUT THE INVENTION

The first embodiment of the present invention will be described below with reference to the drawings. This embodiment will be described using an example of a scanning projection exposure apparatus of the step-and-scan method for effecting scanning exposure of an image of a pattern formed on a mask M1, on a plate P1, while synchronously moving the mask M1 and the plate P1 in a scanning direction with respect to a projection optical apparatus PL consisting of a plurality of catadioptric projection optical systems PL1-PL7 for partially projecting portions of the pattern of the mask (first object) M1 onto the plate (second object) P1 having the outside diameter larger than 500 mm as a photosensitive substrate. The contour larger than 500 mm herein means that one side or diagonal line thereof is larger than 500 mm.

Figure 1:
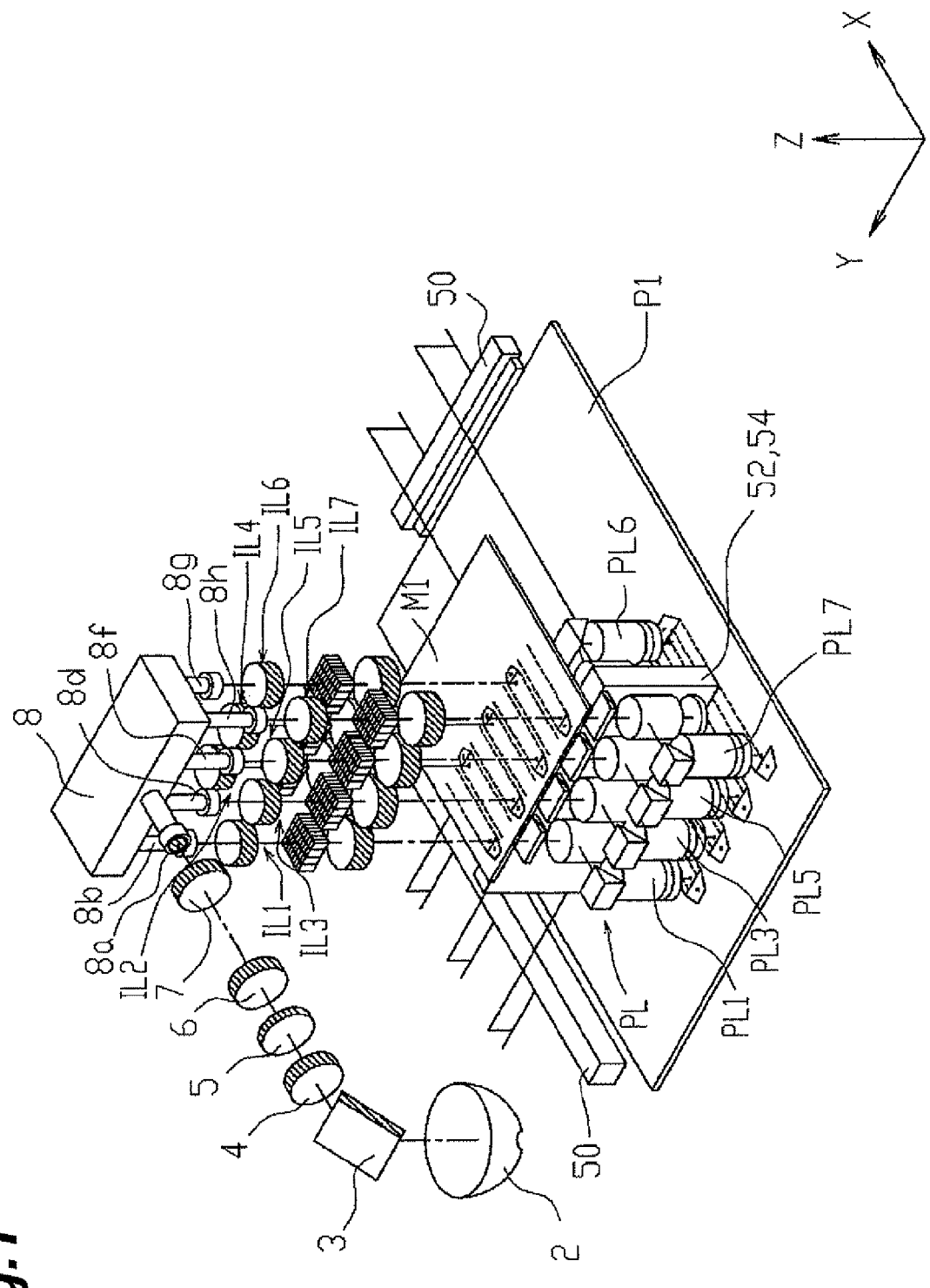
FIG. 1 is a drawing showing a configuration of a scanning exposure apparatus according to the first embodiment.

In the description hereinafter, an orthogonal coordinate system is set as shown in FIG. 1, and positional relations among members will be described with reference to this XYZ orthogonal coordinate system. The XYZ orthogonal coordinate system is so defined that the X-axis and the Y-axis are set in parallel with the plate P1 and that the Z-axis is set along a direction perpendicular to the plate P1. The XYZ coordinate system in the drawings is actually so defined that the XY plane is set in parallel with a horizontal plane and that the Z-axis is set along a vertical direction. In this embodiment, a direction of movement of the plate P1 (scanning direction) is set along the X-direction.

FIG. 1 is a perspective view showing a schematic configuration of the entire scanning projection exposure apparatus according to the present embodiment. The scanning projection exposure apparatus of the present embodiment is provided with a light source, for example, consisting of an ultra-high-pressure mercury lamp. Rays emitted from the light source are reflected by an ellipsoidal mirror 2 and a dichroic mirror 3 to enter a collimator lens 4. Namely, a reflecting film of the ellipsoidal mirror 2 and a reflecting film of the dichroic mirror 3 extract light in a wavelength band including the g-line (wavelength 436 nm), the h line (wavelength 405 nm), and the i-line (wavelength 365 nm), and the light in the wavelength band including the light of the g, h, and; lines is incident into the collimator lens 4. Since the light source is located at a first focus position of the ellipsoidal mirror 2, the light in the wavelength band including the light of the g-, h-, and i-lines forms a light source image at a second focus position of the ellipsoidal mirror 2. A bundle of diverging rays from the light source image formed at the second focus position of the ellipsoidal mirror 2 are collimated into a parallel beam by the collimator lens 4 and the collimated beam is guided through a wavelength selection filter 5 which transmits only light in a predetermined exposure wavelength range.

The beam transmitted by the wavelength selection filter 5 is guided through a neutral density filter 6 and is condensed toward an entrance end of an entrance port 8a of a lightguide fiber 8 by a condenser lens 7. The lightguide fiber 8 herein is a random lightguide fiber, for example, consisting of a large number of optical fibers bundled at random, and has one entrance port 8a and seven exit ports (hereinafter referred to as exit ports 8b, 8c, 8d, 8e, 8f, 8g, and 8h). The beam entering the entrance port 8a of the lightguide fiber 8 propagates inside the lightguide fiber 8, and thereafter is divided and emitted from the seven exit ports 8b-8h, and the divided beams are incident to seven partial illumination optical systems (hereinafter referred to as partial illumination optical systems IL1, IL2, IL3, IL4, IL5, IL6, and IL7), respectively, for partially illuminating the mask M1. Each of the beams having passed through the respective partial illumination optical systems IL1-IL7 approximately uniformly illuminates the mask M1.

Beams from illumination regions on the mask M1, i.e., illumination regions corresponding to the partial illumination optical systems IL1-IL7 are incident into seven projection optical systems (hereinafter referred to as projection optical systems PL1, PL2, PL3, PL4, PL5, PL6, and PL7), respectively, arrayed corresponding to the respective illumination regions and each adapted to project an image of a portion of a pattern on the mask M1 onto the plate P1 The beams having passed through the projection optical systems PL1-PL7 are focused to form respective pattern images of the mask M1 on the plate P1.

Here the mask M1 is fixed by a mask holder (not shown) and is mounted on a mask stage (not shown). The mask stage is equipped with a laser interferometer (not shown) and the mask stage laser interferometer measures and controls the position of the mask stage. The plate P1 is fixed by a plate holder (not shown) and is mounted on a plate stage (not shown). The plate stage is provided with a moving mirror 50. A laser beam emitted from a plate stage laser interferometer not shown is incident to and reflected by the moving mirror 50. The position of the plate stage is measured and controlled based on interference between the incident and reflected laser beams.

The aforementioned partial illumination optical systems IL1, IL3, IL5, and IL7 are arranged as a first row at predetermined intervals in the direction perpendicular to the scanning direction and on the back side (first direction side) in the scanning direction and the projection optical systems PL1, PL3, PL5, and PL7 provided corresponding to the partial illumination-optical systems IL1, IL3, IL5, and IL7 are also arranged similarly as a first row at predetermined intervals in the direction perpendicular to the scanning direction and on the back side (first direction side) in the scanning direction. The partial illumination optical systems IL2, IL4, and IL6 are arranged as a second row at predetermined intervals in the direction perpendicular to the scanning direction and on the front side (second direction side) in the scanning direction and the projection optical systems PL2, PL4, and PL6 provided corresponding to the partial illumination optical systems IL2, IL4, and IL6 are also arranged similarly as a second row at predetermined intervals in the direction perpendicular to the scanning direction and on the front side (second direction side) in the scanning direction.

Here the first row of projection optical systems PL1, PL3, PL5, PL7 have their respective field of views along the first row on a first plane on which the mask M1 is placed, and form their respective images in image fields (projection regions) at predetermined intervals in the direction perpendicular to scanning, on a third row on a second plane on which the plate P1 is placed. The second row of projection optical systems PL2, PL4, and PL6 have their respective field of views along the second row on the first plane on which the mask M1 is placed, and form their respective images in image fields (projection regions) at predetermined intervals in the direction perpendicular to scanning, on a fourth row on the second plane on which the plate P1 is placed.

Between the first row of projection optical systems and the second row of projection optical systems there are an off-axis alignment system 52 for positioning of the plate P1 and an autofocus system 54 for keeping the mask M1 and the plate P1 in focus.

Figure 2:
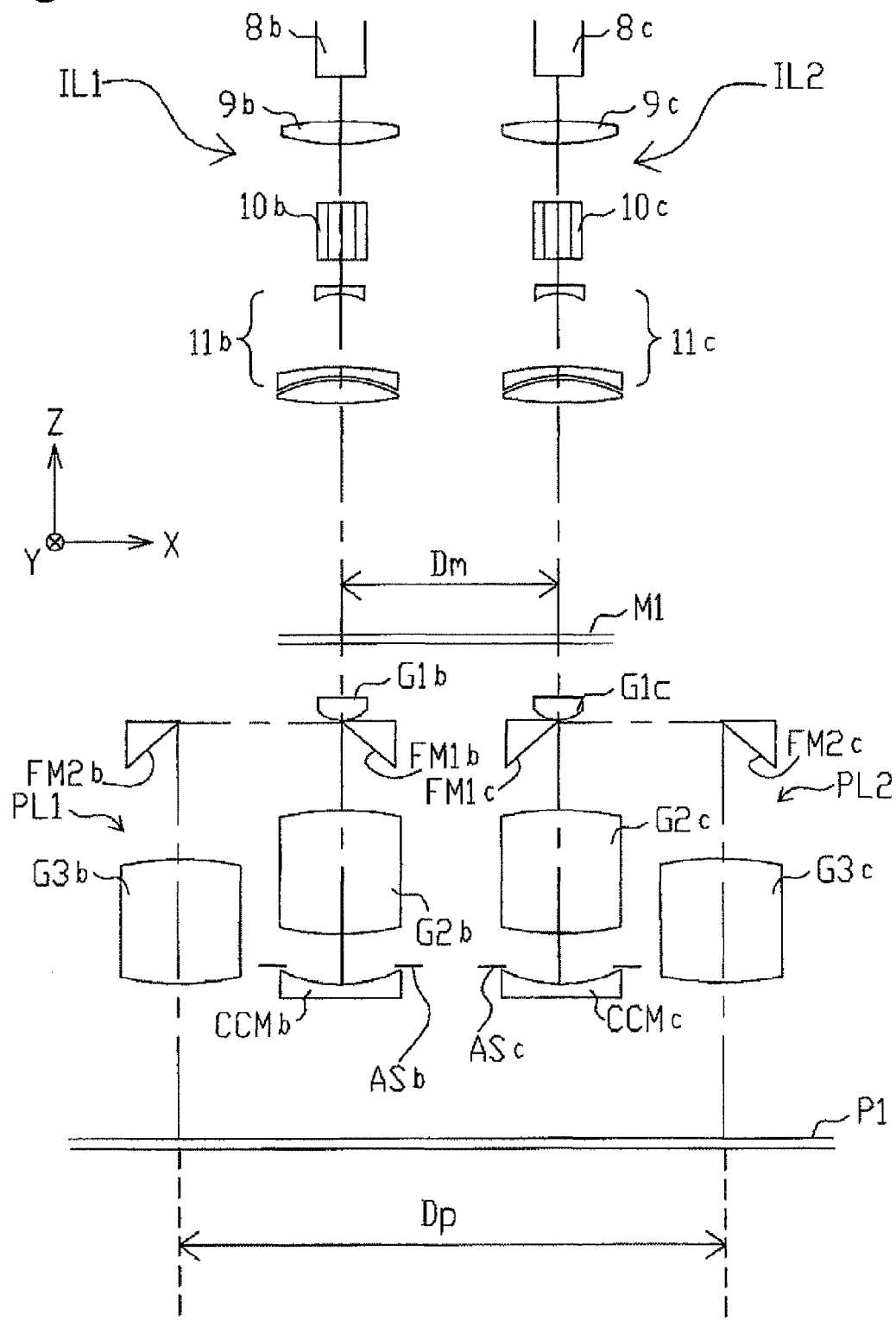
FIG. 2 is a drawing showing configurations of illumination optical systems and projection optical systems according to the first embodiment.

FIG. 2 is a drawing showing configurations of the partial illumination optical systems IL1, IL2 and the projection optical systems PL1, PL2. The partial illumination optical systems IL3, IL5, and IL7 have the same configuration as the partial illumination optical system IL1, and the partial illumination optical systems IL4, IL6 have the same configuration as the partial illumination optical system IL2. The projection optical systems PL3, PL5, and PL7 have the same configuration as the projection optical system PL1, and the projection optical systems PL4, PL6 have the same configuration as the projection optical system PL2.

A beam emitted from the exit port 8b of the lightguide fiber 8 is incident into the partial illumination optical system IL1, is condensed by a collimator lens 9b located near the exit port 8b, and is then incident into a fly's-eye lens 10b as an optical integrator. A large number of secondary light sources are formed on the rear focal plane of the fly's-eye lens 10b and beams from the secondary light sources are condensed by a condenser lens 11b to approximately uniformly illuminate the mask M1. A beam condensed by a collimator lens 9c located near the exit port 8c is incident into a fly's-eye lens 10c as an optical integrator. A large number of secondary light sources are formed on the rear focal plane of the fly's-eye lens 10c and beams from the secondary light sources are condensed by a condenser lens 11c to approximately uniformly illuminate the mask M1.

The projection optical system PL1 is a catadioptric projection optical system for forming a primary image as an enlargement image of a pattern in the field of view on the mask M1, in the image field on the plate P1, a magnification of which in the scanning direction (X-axis direction) is over +1× and a magnification of which in the direction perpendicular to scanning is below −1.

The projection optical system PL1 has the following members: concave reflecting mirror CCMb disposed in the optical path between mask M1 and plate P1; first lens unit G1b disposed in the optical path between mask M1 and concave reflecting mirror CCMb; second lens unit G2b disposed in the optical path between first lens unit G1b and concave reflecting mirror CCMb; first deflecting member FM1b disposed in the optical path between second lens unit G2b and plate P1 and adapted to deflect light traveling in the −Z-axis direction from the second lens unit G2b, into the −X-axis direction (first direction) so as to traverse the optical axis of the first lens unit G1b; second deflecting member FM2b disposed in the optical path between first deflecting member FM1b and plate P1 and adapted to deflect light traveling in the −X-axis direction from the first deflecting member FM1b, into the −Z-axis direction; third lens unit G3b disposed in the optical path between second deflecting member FM2b and plate P1 and having an optical axis approximately parallel to the optical axis of the first lens unit G1b.

Here the first deflecting member FM1b and the second deflecting member FM2b can constitute, for example, a first beam shifter for shifting the light traveling in the −Z-axis direction from the second lens unit G2b, into the −X-axis direction (first direction) and thereafter making the light travel along the −Z-axis direction. In the projection optical system PL1 the concave reflecting mirror CCMb, the first lens unit G1b, the second lens unit G2b, the third lens unit G3b, the first deflecting member FM1b, and the second deflecting member FM2b each are arranged so that the distance between the mask M1 and the plate P1 is larger than the distance between the mask M1 and the concave reflecting mirror CCMb. Furthermore, every optical member with a refracting power forming the first lens unit G1b, the second lens unit G2b, and the third lens unit G3b is arranged so that the optical axis thereof is parallel to the direction of gravity. In the projection optical system PL1 the first lens unit G1b, the concave reflecting mirror CCMb, and the third lens unit G3b are arranged so that the distance on the plate P1 side is larger than the distance on the mask M1 side.

An aperture stop ASb for determining the numerical aperture on the plate P1 side of the projection optical system PL1 is provided in the optical path between the concave reflecting mirror CCMb and the second lens unit G2b, i.e., near a reflecting surface of the concave reflecting mirror CCMb, and the aperture stop ASb is positioned so that the projection optical system becomes approximately telecentric on the mask M1 side and on the plate P1 side. The position of this aperture stop ASb can be regarded as a pupil plane of the projection optical system PL1.

The projection optical system PL1 satisfies the following relations:

$$0.8 \times |\beta| \leq f3/f1 \leq 1.25 \times |\beta|, \text{and}$$

$$|\beta| \geq 1.8,$$

where f1 is the focal length of the first lens unit G1b of the projection optical system PL1, f3 is the focal length of the third lens unit G3b, and β is the magnification of the projection optical system PL1.

The projection optical system PL2 has the configuration arranged in symmetry in the scanning direction with the projection optical system PL1 and is also a catadioptric projection optical system for forming a primary image as an enlargement image of a pattern in the field of view on the mask M1, in the image field on the plate P1 as the projection optical system PL1 was. A magnification of the projection optical system PL2 in the scanning direction (X-axis direction) is over +1 and a magnification of the projection optical system PL2 in the direction perpendicular to scanning is below −1.

The projection optical system PL2, like the projection optical system PL1, has a concave reflecting mirror CCMc, a first lens unit G1c, a second lens unit G2c, a third lens unit G3c, a first deflecting member FM1c, a second deflecting member FM2b, and an aperture stop ASb.

The first deflecting member FM1c and the second deflecting member FM2b of the second projection optical system PL2 can constitute, for example, a second beam shifter for shifting the light traveling in the −Z-axis direction from the second lens unit G2c, into the +X-axis direction (second direction) and thereafter making the light travel along the −Z-axis direction. The position of the aperture stop ASc can be regarded as a pupil plane of the projection optical system PL2.

The projection optical system PL1 and the projection optical system PL2 are arranged to satisfy the following relation:

$$Dp = Dm \times |\beta| (\text{where } |\beta| > 1.8),$$

where Dm is an interval in the scanning direction (X-axis direction) between the centers of the field of views of the projection optical system PL1 and the projection optical system PL2, Dp is an interval in the scanning direction (X-axis direction) between the centers of the image fields by the projection optical system PL1 and the second projection optical system PL2, and β is the projection magnification of each of the projection optical system PL1 and the projection optical system PL2.

In the present embodiment, a first line segment (corresponding to the optical axis of the first beam shifter in the present embodiment) as a line segment connecting the field of view and the image field (projection region) of the first projection optical system PL1 does not overlap with a second line segment (corresponding to the optical axis of the second beam shifter in the present embodiment) as a line segment connecting the field of view and the image field (projection region) of the second projection optical system PL2 when viewed from the Y-direction.

Figure 3:
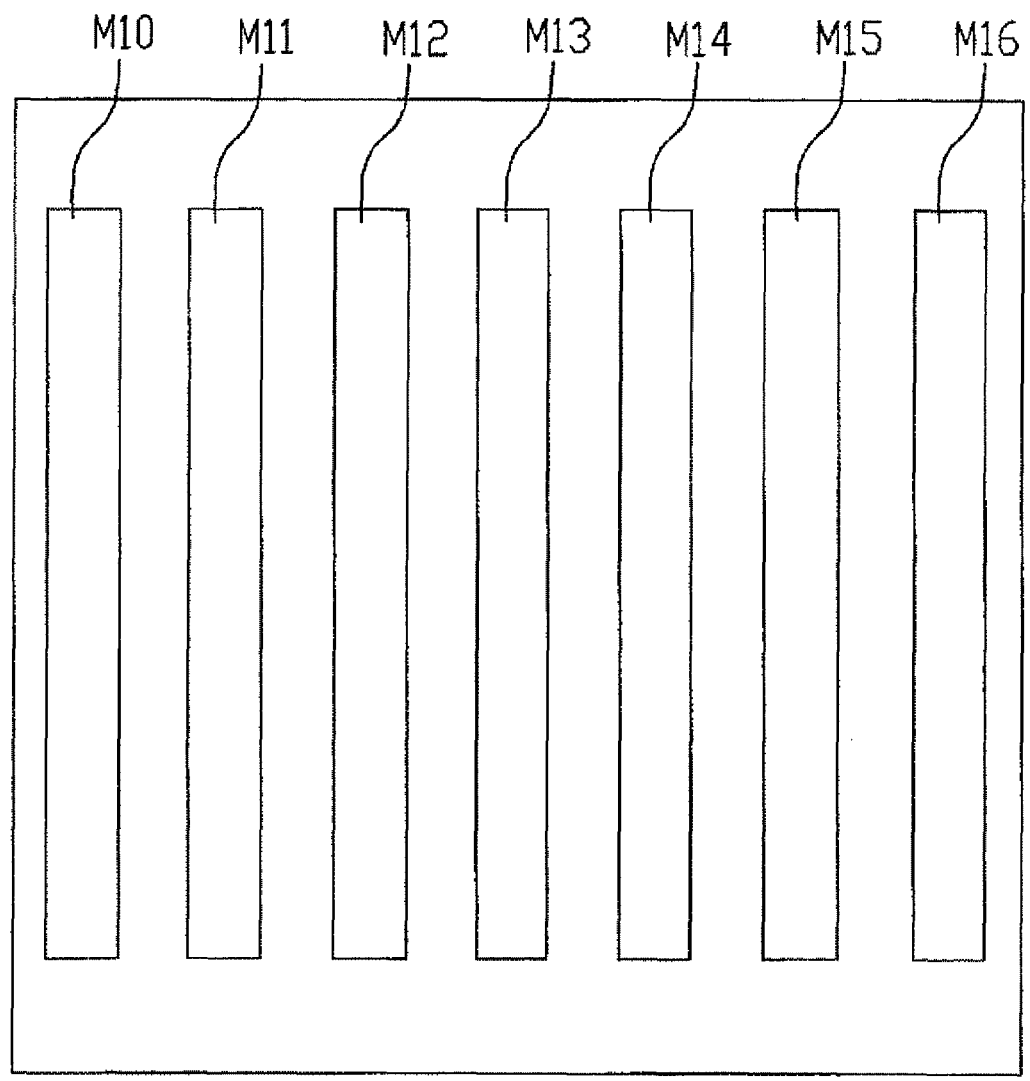
FIG. 3 is a drawing showing a mask used in the scanning exposure apparatus according to the embodiment.

FIG. 3 is a drawing showing a configuration of the mask M1 used in the scanning exposure apparatus according to this embodiment. As shown in FIG. 3, the mask M1 has line pattern portions M10-M16 arranged along the non-scanning direction (Y-axis direction). The field of view of the projection optical system PL1 is positioned to the line pattern portion M10 and the field of view of the projection optical system PL2 is positioned to the line pattern portion M11. Similarly, the field of views of the projection optical systems PL3-PL7 are positioned to the line pattern portions M12-M16, respectively.

Figure 4:
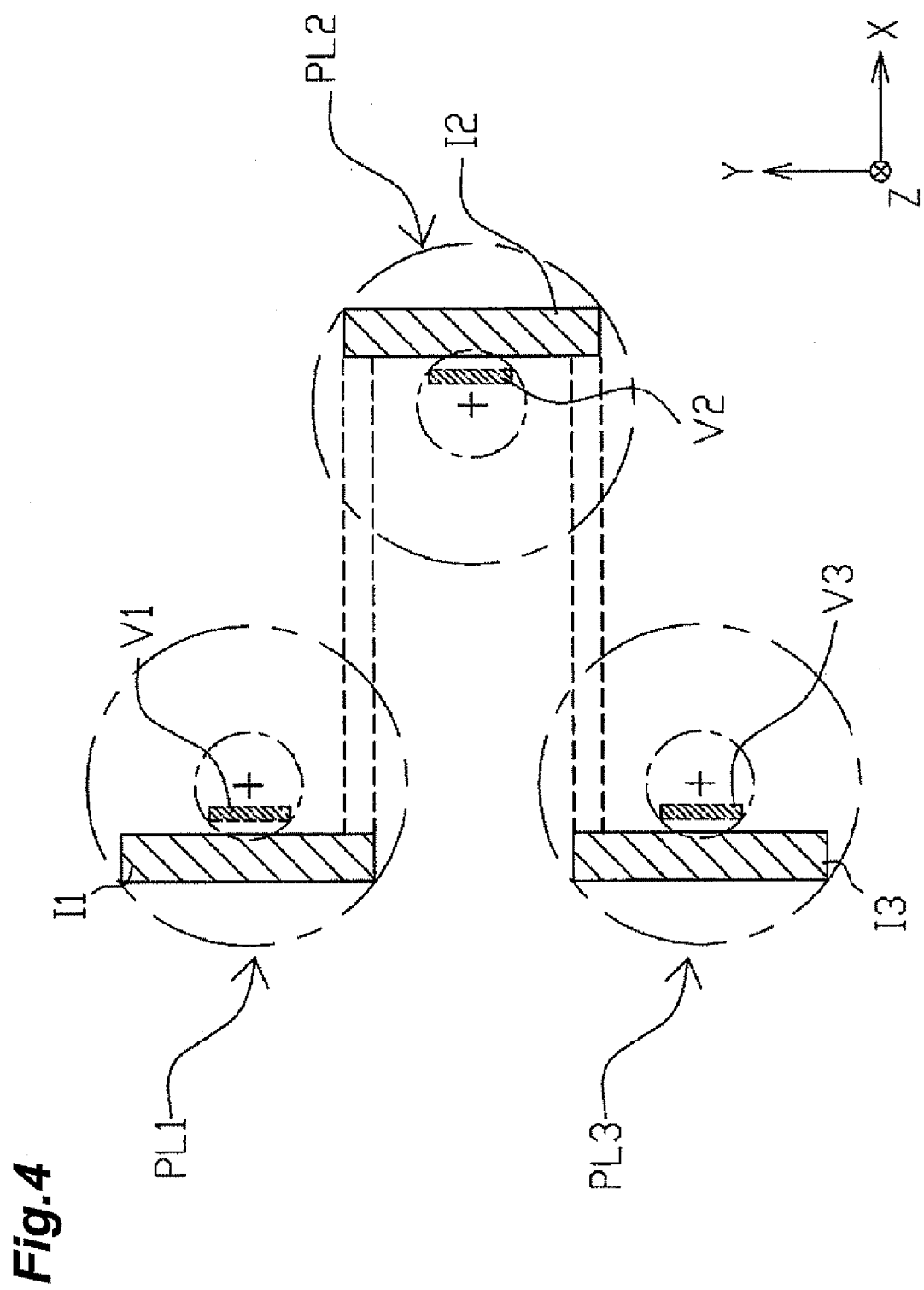
FIG. 4 is a drawing showing field of views and image fields of the projection optical systems according to the first embodiment.

FIG. 4 is a drawing for explaining a state of the field of views and image fields of the projection optical systems PL1, PL3 arranged in the first row and the projection optical system PL2 arranged in the second row. The projection optical system PL1 has the field of view V1 and the image field I1, the projection optical system PL2 the field of view V2 and the image field I2, and the projection optical system PL3 the field of view V3 and the image field I3. Namely, the projection optical system PL2 forms an enlargement image of a pattern in the field of view V1 on the mask M1, in the image field I1 on the plate P1. Similarly, the projection optical system PL2 forms an enlargement image of a pattern in the field of view V2 on the mask M1, in the image field I2 on the plate P1 and the projection optical system PL3 an enlargement image of a pattern in the field of view V3 on the mask M1, in the image field I3 on the plate P1.

A joint part is formed between the image field I1 of the projection optical system PL1 and the image field I2 of the projection optical system PL2 and a joint part between the image field I2 of the projection optical system PL2 and the image field I3 of the projection optical system PL3. The patterns can be continuously formed on the plate P1, for example, by forming the edges of the patterns on the mask to form the joint parts on the plate P1, in a zigzag pattern.

In the present embodiment, since the relation of $Dp=\beta \times Dm$ is satisfied by the interval between the field of views (the distance between the first row and the second row) Dp and the interval between the image fields (projection regions) (the distance between the third row and the fourth row) Dm of the first and second projection optical systems PL1, PL2 where $\beta$ is the magnification along the scanning direction of the first and second projection optical systems PL1, PL2, the patterns can be continuously formed on the plate P1 even if the mask M1 used is one wherein the edges of the respective line pattern portions M11-M16 in the scanning direction as shown in FIG. 3 are aligned to minimize the size of the mask in the scanning direction.

According to the catadioptric projection optics of the present embodiment, since the first lens unit, the second lens unit, and the third lens unit with the optical members having the refracting power are arranged so that the optical axis thereof is parallel to gravity, the highly accurate catadioptric projection optical systems can be provided without occurrence of deformation asymmetric with respect to the optical axis in the lenses even if the size is increased for the lenses forming the projection optical systems, i.e., the lenses forming the first lens unit, second lens unit, and third lens unit, in order to increase the exposure region. According to the catadioptric projection optics of the present embodiment, no intermediate image is formed, and thus the optical configuration can be simplified.

Since the scanning exposure apparatus of the present invention has the highly accurate catadioptric projection optical systems free of occurrence of deformation asymmetric with respect to the optical axis in the lenses, it is able to perform good exposure. Since the catadioptric projection optical systems have the enlargement magnification, it is feasible to avoid increase in the size of the mask and to reduce the manufacturing cost of the mask.

The next will describe the illumination optical systems and projection optical systems used in the scanning exposure apparatus according to the second embodiment of the present invention. The illumination optical systems and projection optical systems of the second embodiment are arranged in such a manner that an illumination field stop is disposed in each illumination optical system in the configurations of the illumination optical systems and projection optical systems of the first embodiment. Except for it, the illumination optical systems and the projection optical systems of the second embodiment have the same configuration as the illumination optical systems and projection optical systems of the first embodiment. In the description of the second embodiment, therefore, detailed description will be omitted for the same configuration as the illumination optical systems and projection optical systems of the first embodiment. In the description of the illumination optical systems and the projection optical systems of the second embodiment, the same configuration as the illumination optical systems and projection optical systems of the first embodiment will be explained with the same reference symbols as those in the first embodiment.

Figure 5:
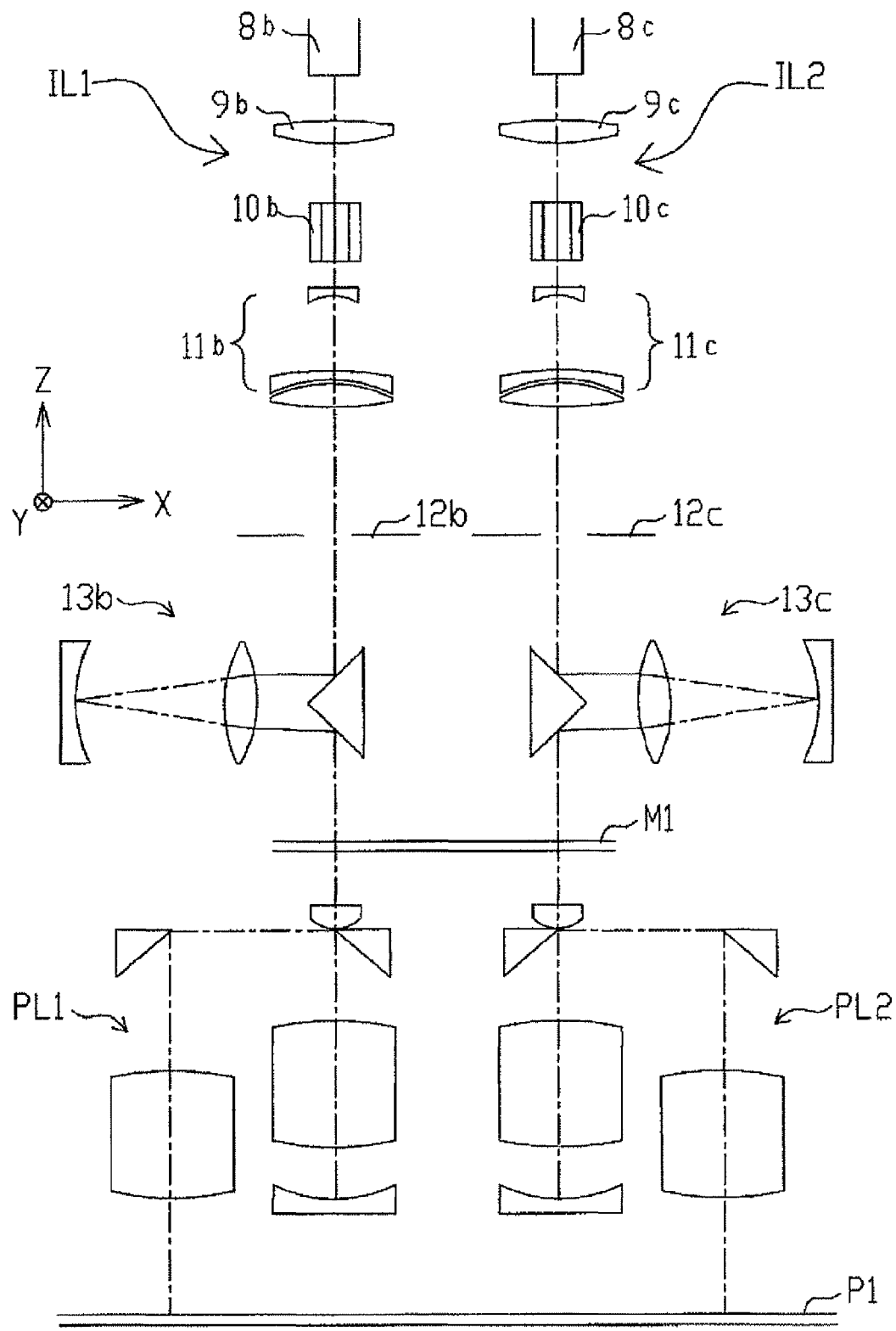
FIG. 5 is a drawing showing configurations of illumination optical systems and projection optical systems according to the second embodiment.

FIG. 5 is a drawing showing the configurations of the illumination optical systems and the projection optical systems of the second embodiment. FIG. 5 shows only the illumination optical systems IL1, IL2 and the projection optical systems PL1, PL2, but each of the illumination optical systems IL13-IL7 and the projection optical systems PL3-PL7 also has the same configuration. An illumination field stop 12b with an aperture of a trapezoid or hexagonal shape is located at a position optically conjugate with the mask M1, on the exit side of the condenser lens 11b in the illumination optical system IL1 of the present embodiment, and an imaging optical system 13b is disposed in the optical path between the illumination field stop 12b and the mask M1. Similarly, an illumination field stop 12c is located at a position optically conjugate with the mask M1, on the exit side of the condenser lens 11c in the illumination optical system IL2 and an imaging optical system 13c is disposed in the optical path between the illumination field stop 12c and the mask M1.

Figure 6:
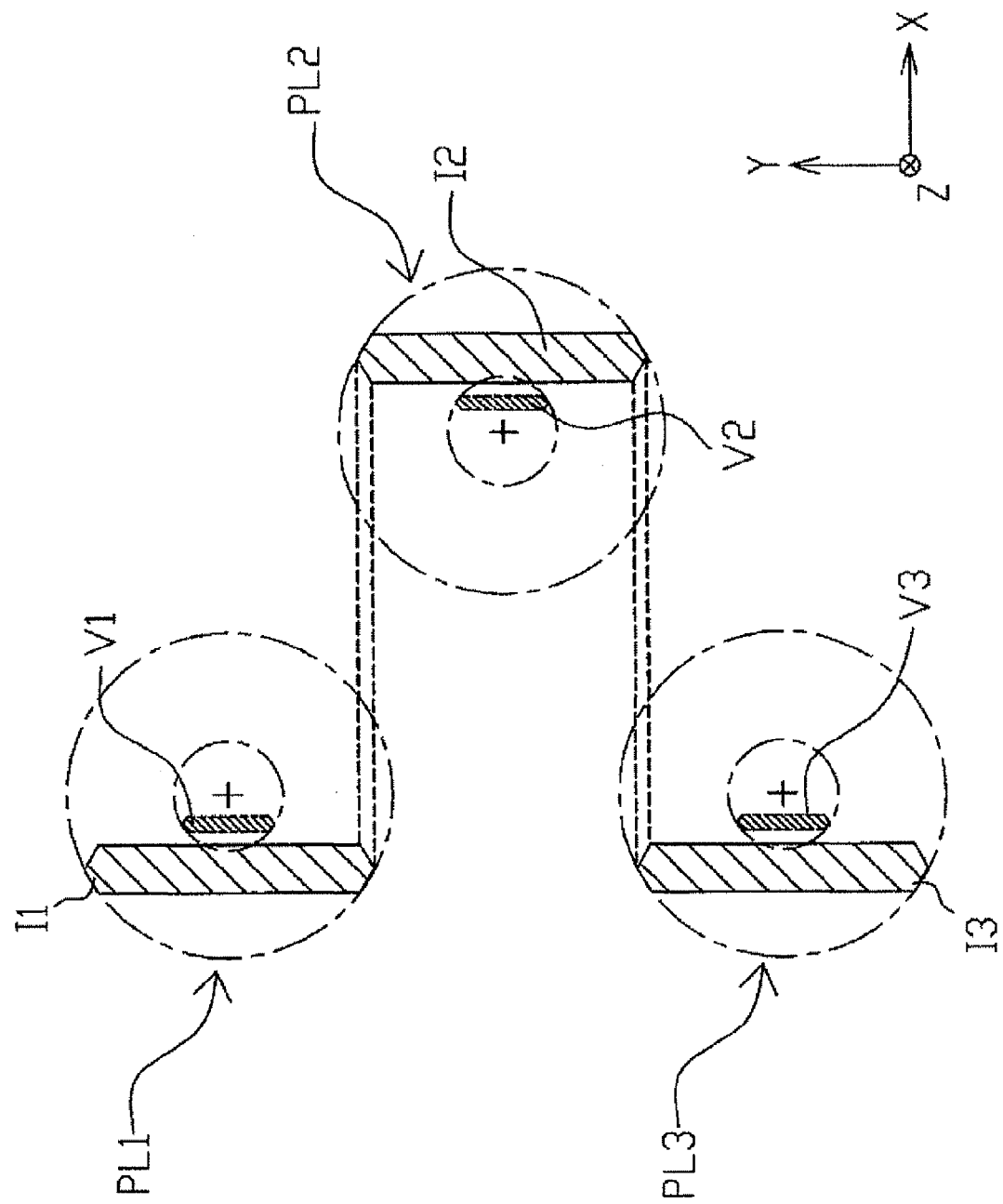
FIG. 6 is a drawing showing field of views and image fields of the projection optical systems according to the second embodiment.

FIG. 6 is a drawing for explaining a state of field of views and image fields of the projection optical systems PL1, PL3 and the projection optical system PL2 in the case where the illumination field stops with the aperture of the hexagonal shape are located in the illumination optical systems. The projection optical system PL1 has the field of view V1 and image field I1 of the hexagonal shape, the projection optical system PL2 the field of view V2 and image field I2 of the hexagonal shape, and the projection optical system PL3 the field of view V3 and image field I3 of the hexagonal shape. Namely, the projection optical system PL1 forms an enlargement image of a pattern in the field of view V1 on the mask M11 the shape of which is defined by the illumination field stop, in the image field I1 on the plate P1. Similarly, the projection optical system PL2 forms an enlargement image of a pattern in the field of view V2 on the mask M1, the shape of which is defined by the illumination field stop, in the image field I2 on the plate P1 and the projection optical system PL3 an enlargement image of a pattern in the field of view V3 on the mask M1 in the image field I3 on the plate P1.

The illumination optical systems of the present embodiment can well combine the patterns on the plate in the non-scanning direction, without need for the screen synthesis based on the mask patterns as in the scanning exposure apparatus of the first embodiment.

The next will describe the illumination optical systems and projection optical systems used in the scanning exposure apparatus according to the third embodiment of the present invention. The illumination optical systems and projection optical systems of this third embodiment are arranged in such a manner that the configuration of each projection optical system is modified out of the illumination optical systems and projection optical systems of the first embodiment. Except for it, the illumination optical systems and projection optical systems of the present embodiment have the same configuration as the illumination optical systems and projection optical systems of the first embodiment. In the description of the third embodiment, therefore, detailed description will be omitted for the same configuration as the illumination optical systems and projection optical systems of the first embodiment. In the description of the illumination optical systems and projection optical systems of this third embodiment, the same configuration as the illumination optical systems and projection optical systems of the first embodiment will be described with the same reference symbols as those in the first embodiment.

Figure 7:
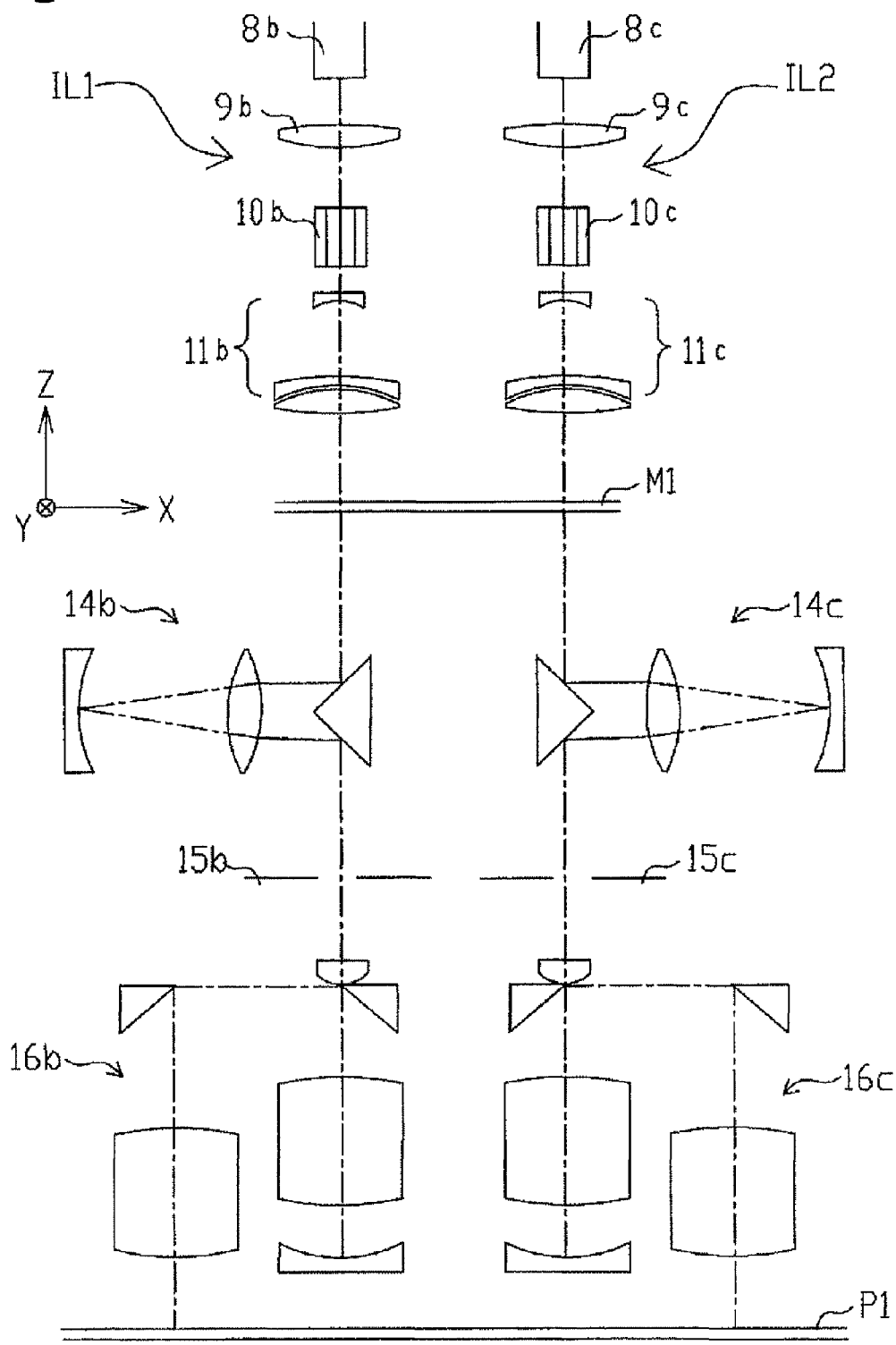
FIG. 7 is a drawing showing configurations of illumination optical systems and projection optical systems according to the third embodiment.

FIG. 7 is a drawing showing the configurations of the illumination optical systems and projection optical systems of the third embodiment. FIG. 7 shows only the illumination optical systems IL1, IL2 and the projection optical systems PL1, PL2, but each of the illumination optical systems IL3-IL7 and the projection optical systems PL3-PL7 also has the same configuration.

Each projection optical system PL1, PL2 of the present embodiment is composed of a projection optical apparatus with a first imaging optical system 14b, 14c for forming an intermediate image of the mask M1, and a second imaging optical system 16b, 16c for making the intermediate image optically conjugate with the plate P1. Magnifications of these projection optical systems PL1, PL2 are so set that the magnification in the scanning direction is over +1 and that the magnification in the direction perpendicular to scanning is over +1. Namely, each of these projection optical systems PL1, PL2 forms an erect normal image of the first plane at the magnification on the second plane.

Field stops 15b, 15c are located at positions where the intermediate image is formed, in the optical path between the first imaging optical system 14b, 14c and the second imaging optical system 16b, 16c. The second imaging optical systems 16b, 16c have the same configuration as the projection optical systems PL1, PL2 of the first embodiment.

The projection optical systems of the present embodiment are able to perform highly accurate projection because the field stops can be readily arranged and the field stops can be projected onto the plate with the accuracy of the projection optical systems.

The next will describe the projection optical systems used in the scanning exposure apparatus according to the fourth embodiment of the present invention. The projection optical systems of the fourth embodiment are provided with an optical property adjusting mechanism in comparison with the projection optical systems of the first embodiment. Except for it, the projection optical systems of the present embodiment have the same configuration as the projection optical systems of the first embodiment. In the description of the fourth embodiment, therefore, detailed description will be omitted for the same configuration as the projection optical systems of the first embodiment. In the description of the projection optical systems of this fourth embodiment, the same configuration as the projection optical systems of the first embodiment will be described with the same reference symbols as those in the first embodiment.

Figure 8:
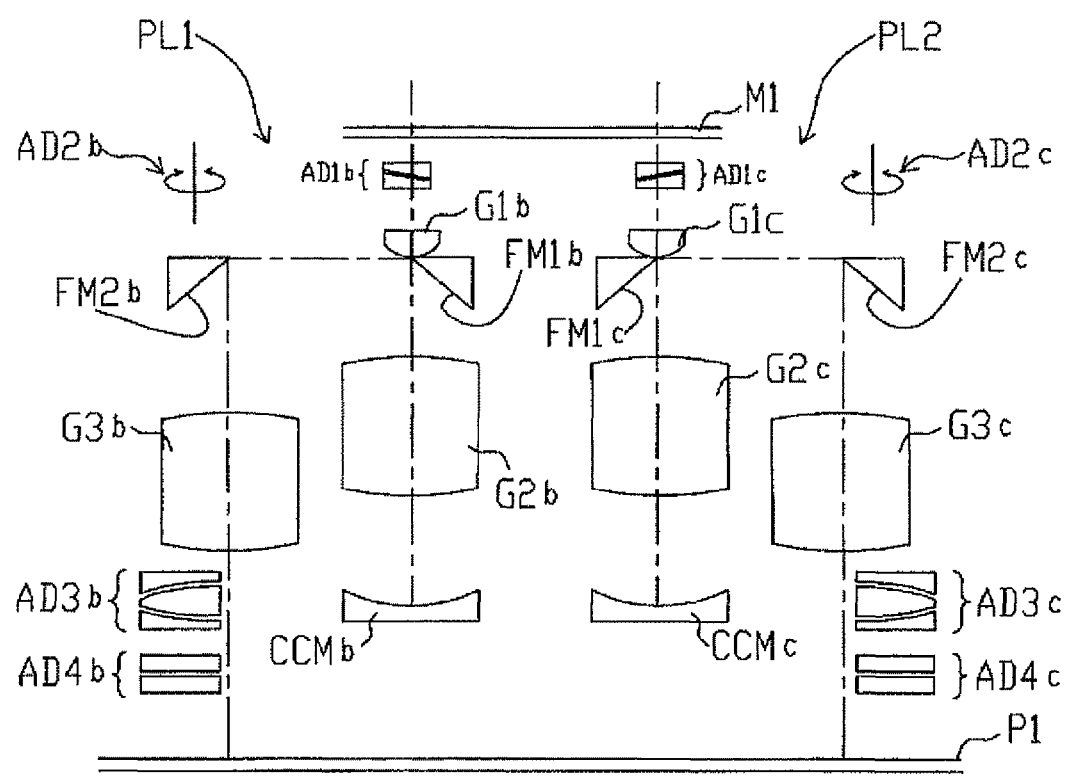
FIG. 8 is a drawing showing configurations of projection optical systems according to the fourth embodiment.

FIG. 8 is a drawing showing the configuration of the projection optical systems of the fourth embodiment. FIG. 8 shows only the projection optical systems PL1, PL2, but each of the projection optical systems PL3-PL7 also has the same configuration. Each projection optical system PL1, PL2 is provided with a first optical property adjusting mechanism AD1b, AD1c composed of a pair of wedge-shaped glasses in the optical path between the mask M1 and the first lens unit G1b, G1c. This first optical property adjusting mechanism AD1b, AD1c permits adjustment of focus and inclination of the image plane by changing the glass thickness through movement of the paired glasses along the wedge angle. Since in the present embodiment the first optical property adjusting mechanism AD1b, AD1c is located in the optical path on the reduction side of the catadioptric system (the object side with respect to the position of the aperture stop in the catadioptric system), a large change in an optical property can be implemented against a movement amount of the adjusting mechanism. Namely, it is feasible to enhance the sensitivity of action of the adjusting mechanism. This leads eventually to expansion of an adjustment range of the optical property, without need for increase in the movement amount range (stroke) of the adjusting mechanism.

Each projection optical system PL1, PL2 is also provided with a second optical property adjusting mechanism AD2b, AD2c composed of a rotating mechanism of the second path deflecting surface FM2b, FM2c. This second optical property adjusting mechanism AD2b, AD2c can adjust rotation of the image through rotation of a prism mirror having the second path deflecting surface FM2b, FM2c. In addition, each projection optical system is provided with a third optical property adjusting mechanism AD3b, AD3c composed of a lens unit of three lenses having the same curvature. This third optical property adjusting mechanism AD3b, AD3c can adjust the magnification through vertical (up and down) movement of the center lens in the lens unit of three lenses having the same curvature, between the mask M1 and the plate P1. Furthermore, each projection optical system is provided with a fourth optical property adjusting mechanism AD4b, AD4c composed of plane-parallel plates. This fourth optical property adjusting mechanism AD4b, AD4c can adjust the position of the image through inclination of the plane-parallel plates relative to the optical axis.

In the present embodiment, the optical property adjusting mechanisms AD2b, AD2c, AD3b, AD3c are located in the optical path between the concave reflecting mirror CCMb, CCMc and the second plane, i.e., in the optical path between the pupil plane and the second plane. Since this optical path is the one on the enlargement side in the projection optical system, this arrangement has the advantage that it is easy to secure the spaces where these optical property adjusting mechanisms are arranged.

Figure 9:
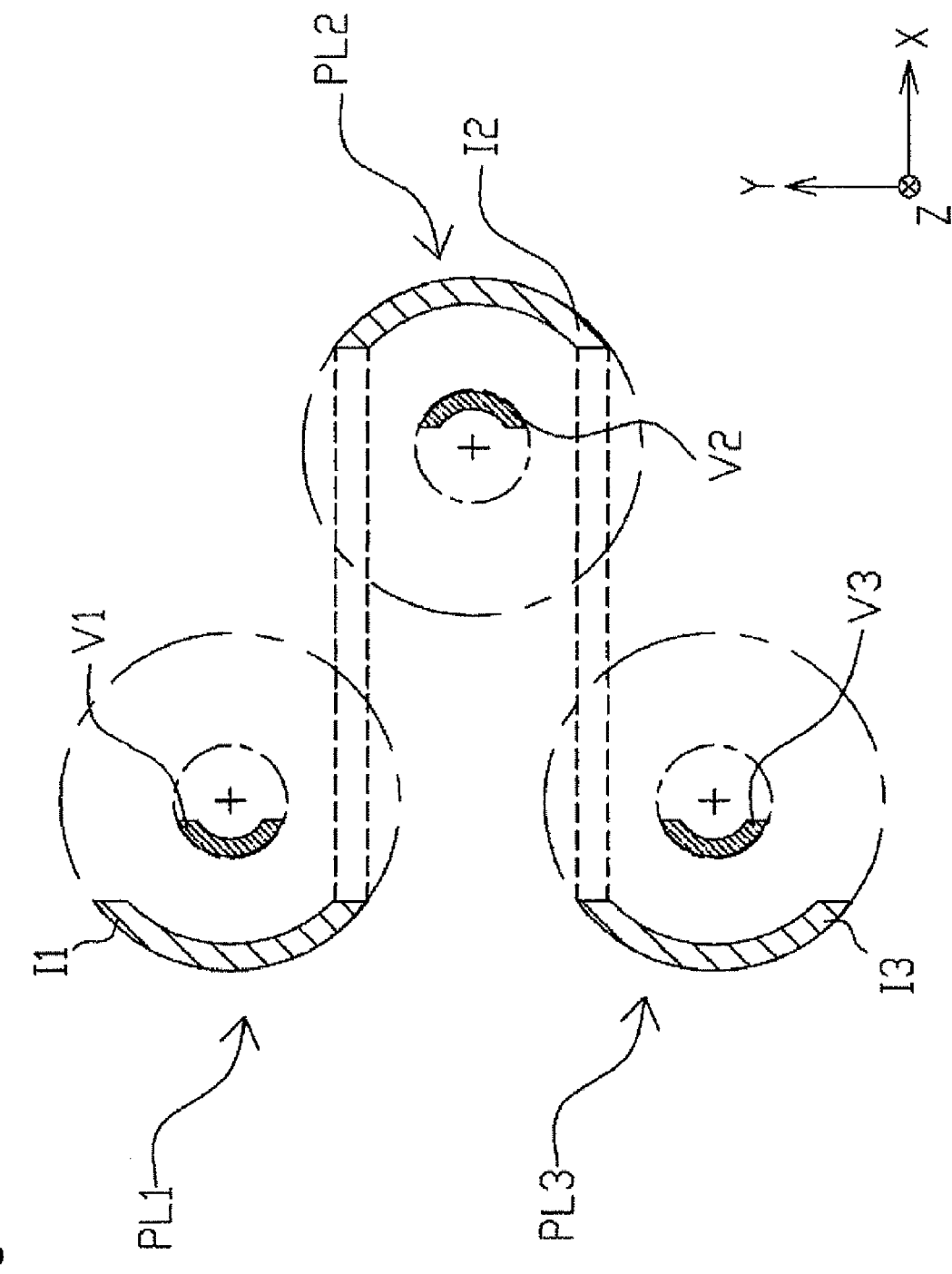
FIG. 9 is a drawing showing field of views and image fields of projection optical systems in a case where an illumination field stop with an aperture of an arcuate shape is placed in each of illumination optical systems.

In the above-described second embodiment the illumination field stop with the aperture of the hexagonal shape was arranged in each illumination optical system, but, instead thereof, it is also possible to arrange the illumination field stop of an arcuate shape in each illumination optical system. FIG. 9 is a drawing for explaining a state of field of views and image fields of the projection optical systems PL1, PL3 and the projection optical system PL2 in the case where the illumination field stops with the aperture of the arcuate shape are arranged in the illumination optical systems. The projection optical system PL1 has the field of view V1 and image field I1 of the arcuate shape, the projection optical system PL2 the field of view V2 and image field I2 of the arcuate shape, and the projection optical system PL3 the field of view V3 and image field I3 of the arcuate shape. Namely, the projection optical system PL1 forms an enlargement image of a pattern in the field of view V1 of the arcuate shape on the mask M1, the shape of which is defined by the illumination field stop, in the image field I1 of the arcuate shape. Similarly, the projection optical system PL2 forms an enlargement image of a pattern in the field of view V2 of the arcuate shape on the mask M1, the shape of which is defined by the illumination field stop, in the image field I2 of the arcuate shape on the plate P1, and the projection optical system PL3 forms an enlargement image of a pattern in the field of view V3 of the arcuate shape on the mask M1, in the image field I3 of the arcuate shape on the plate P1.

In the above-described third embodiment the second imaging optical systems 16b, 16c have the same configuration as the projection optical systems PL1, PL2 in the first embodiment, but the first imaging optical systems 14b, 14c, or the first imaging optical systems 14b, 14c and second imaging optical systems 16b, 16c may be arranged to have the same configuration as the projection optical systems PL1, PL2 in the first embodiment.

In the above embodiments, the shape of the image fields formed by the projection optical systems may be, for example, a trapezoid shape. When the image fields are of the trapezoid shape, it is preferable to locate the lower side of the trapezoid (the longer side out of the two mutually parallel sides in the trapezoid) on the optical axis side.

In the above embodiments the light source was the discharge lamp, and the apparatus was arranged to select the necessary light including the light of the g-line (436 nm), the h line (405 nm), and the i-line (365 nm). However, without having to be limited to this, the present invention is also applicable to cases where the light is one of light from an ultraviolet LED, laser beams from a KrF excimer laser (248 nm) and an ArF excimer laser (193 nm), harmonics of solid-state lasers, and laser beams from ultraviolet semiconductor lasers as solid light sources.

Figure 10:
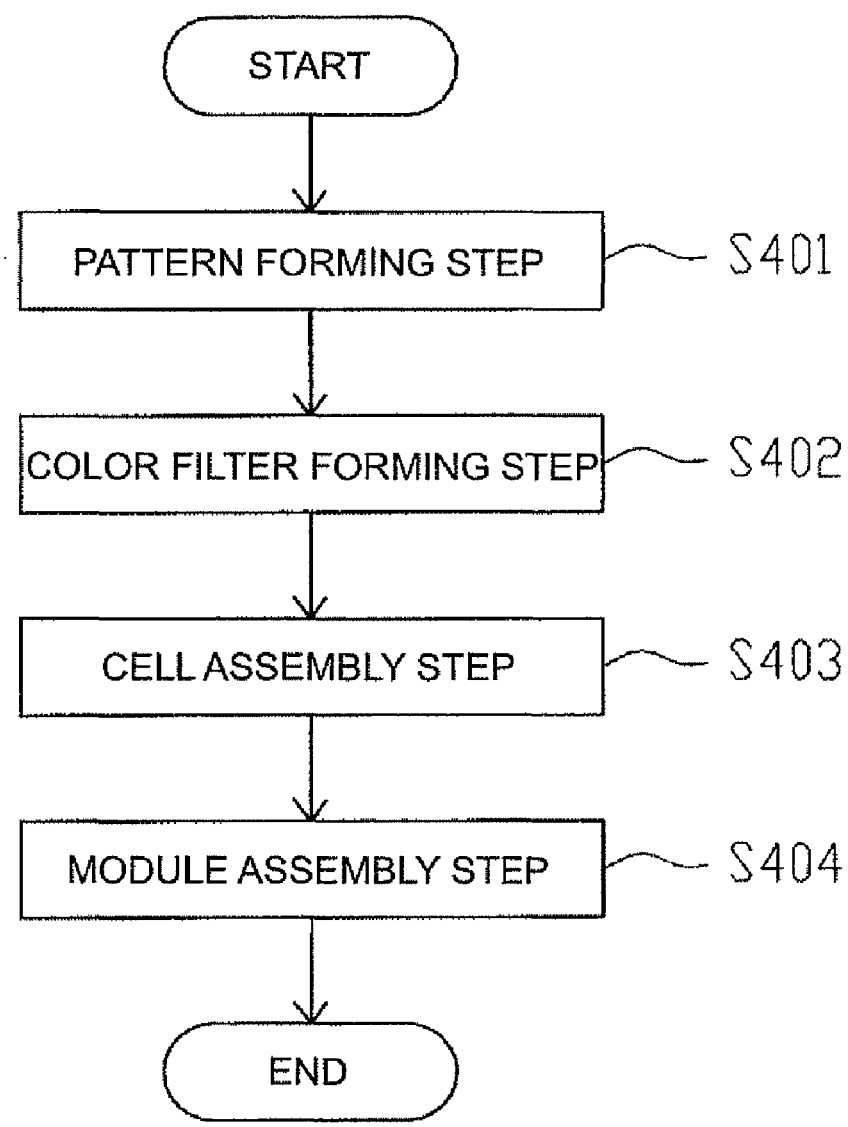
FIG. 10 is a flowchart for explaining a microdevice manufacturing method according to an embodiment.

The scanning exposure apparatus of the embodiment can also be used to manufacture a liquid-crystal display device as a microdevice by forming predetermined patterns (circuit patterns, electrode patterns, etc.) on plates (glass substrates). The following will describe an example of a method in this case with reference to the flowchart of FIG. 10. In FIG. 10, a pattern forming step 401 is to execute a so-called photolithography step to transfer a pattern of a mask onto a photosensitive substrate by means of the exposure apparatus of the embodiment. This photolithography step results in forming the predetermined pattern including a number of electrodes and others on the photosensitive substrate. Thereafter, the exposed substrate is processed through steps including a development step, an etching step, a resist removal step, etc. to form the predetermined pattern on the substrate, followed by a next color filter forming step 402.

The next color filter forming step 402 is to form a color filter in a structure in which a large number of sets of three dots corresponding to R (Red), G (Green), and B (Blue) are arrayed in a matrix pattern or in a structure in which a plurality of filter sets of three stripes of R, G, and B are arrayed in the horizontal scanning line direction. After the color filter forming step 402, a cell assembly step 403 is executed. The cell assembly step 403 is to assemble a liquid crystal panel (liquid crystal cell) using the substrate with the predetermined pattern obtained in the pattern forming step 401, the color filter obtained in the color filter forming step 402, and others. In the cell assembly step 403, for example, a liquid crystal is poured into between the substrate with the predetermined pattern obtained in the pattern forming step 401 and the color filter obtained in the color filter forming step 402, to manufacture the liquid crystal panel (liquid crystal cell).

A module assembly step 404 subsequent thereto is to attach to the panel, various components such as electric circuits, backlights, etc. for display operation of the liquid crystal panel (liquid crystal cell) thus assembled, thereby completing a liquid-crystal display device. Since the aforementioned manufacturing method of the liquid-crystal display device uses the scanning exposure apparatus of the embodiment, the liquid-crystal display device can be manufactured at low cost.

In the catadioptric projection optical systems and catadioptric optical apparatus of the present invention, the first lens unit, the second lens unit, and the third lens unit with the optical members having the refracting power are arranged so that the optical axis thereof is parallel to gravity; therefore, even if the sizes of the lenses forming the projection optical systems, i.e., the sizes of the lenses constituting the first lens unit, the second lens unit, and the third lens unit are increased, for example, in order to increase the exposure region, the highly accurate catadioptric projection optical systems and catadioptric optical apparatus can be provided without occurrence of deformation asymmetric with respect to the optical axis in the lenses, and good pattern transfer can be implemented eventually.

In the scanning exposure apparatus of the present invention, the beam shifting members guide the beams from the field of views of the plurality of projection optical systems in the opposite directions along the first direction to the plurality of projection regions, which permits appropriate setting of the interval between the field of views and the interval between the projection regions along the first direction in this case. Therefore, the patterns can be transferred well onto the plate even with the use of the projection optical systems in different rows.

Since the scanning exposure apparatus of the present invention has the highly accurate catadioptric projection optical systems and catadioptric optical apparatus without occurrence of deformation asymmetric with respect to the optical axis in the lenses, good exposure can be performed. Since the catadioptric projection optical systems and catadioptric optical apparatus have the magnification of more than 1×, it is feasible to avoid increase in the size of the mask and to reduce the manufacturing cost of the mask.

Since the microdevice manufacturing method according to the present invention permits the manufacture of the microdevice with use of a large substrate while avoiding increase in the size of the mask, the microdevice can be manufactured at low cost.

EXAMPLES

Example 1 and Example 2 will be described below. Table 1 and Table 2 present the specifications of optical members in catadioptric systems PL10, PL20 in Example 1 and Example 2. In the specifications of the optical members in Table 1 and Table 2, each surface number in the first column represents an order of a surface along a ray traveling direction from the object side, the second column a radius of curvature of each surface (mm), each surface interval in the third column a surface separation on the optical axis (mm), the fourth column the refractive index of a glass material of each optical member for the g line, the fifth column the refractive index of a glass material of each optical member for the h line, and the sixth column the refractive index of a glass material of each optical member for the i line.

Example 1

Figure 11:
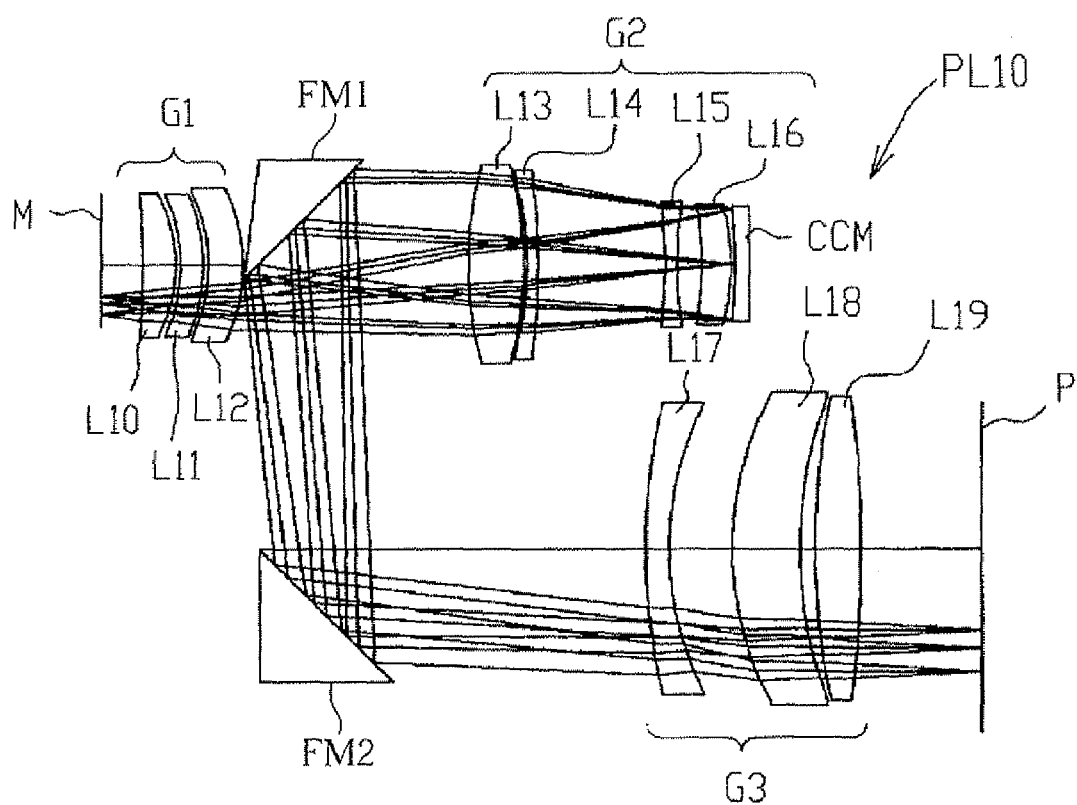
FIG. 11 is a drawing showing a configuration of a projection optical system according to the first example.

As shown in FIG. 11, the catadioptric system PL10 has a concave reflecting mirror CCM, a first lens unit G1, a second lens unit G2, a third lens unit G3, a first deflecting member FM1, and a second deflecting member FM2.

The first lens unit G1 is composed of a positive meniscus lens L10 with a concave surface on the mask M side, a negative meniscus lens L11 with a concave surface on the mask M side, and a negative meniscus lens L12 with a concave surface on the mask M side. The second lens unit G2 is composed of a biconvex lens L13, a negative meniscus lens L14 with a concave surface on the mask M side, a biconcave lens L15, and a positive meniscus lens L16 with a concave surface on the mask M side. The third lens unit G3 is composed of a negative meniscus lens L17 with a concave surface on the plate P side, a positive meniscus lens L18 with a concave surface on the plate P side, and a biconvex lens L19.

The below presents values of the specifications of the catadioptric system PL10 in Example 1.

(Specifications)
Projection magnification: 2.4
Image-side NA: 0.05625
Object-side NA: 0.135
Image field: φ228 mm
Field of view: φ95 mm
Value corresponding to the condition: f3/f1=1430/600=2.38
(Table 1)
(Specifications of Optical Members)

TABLE 1

| men | r | d | n(g) | n(h) | n(i) |
|---|---|---|---|---|---|
| 0) |  | 32.96 | 1 |  |  |
| 1) | −1081.46 | 26.42 | 1.48032 | 1.48273 | 1.48677 |
| 2) | −120.73 | 3.71 | 1 |  |  |
| 3) | −132.13 | 17.85 | 1.59415 | 1.60086 | 1.61279 |
| 4) | −173.30 | 4.40 | 1 |  |  |
| 5) | −128.74 | 26.88 | 1.48032 | 1.48273 | 1.48677 |
| 6) | −149.88 | 180.44 | 1 |  |  |
| 7) | 308.91 | 40.61 | 1.48032 | 1.48273 | 1.48677 |
| 8) | −347.21 | 2.97 | 1 |  |  |
| 9) | −324.77 | 10.83 | 1.46671 | 1.46964 | 1.47456 |
| 10) | −706.41 | 100.05 | 1 |  |  |
| 11) | −603.37 | 9.44 | 1.46671 | 1.46964 | 1.47456 |
| 12) | 290.56 | 20.72 | 1 |  |  |
| 13) | −244.53 | 23.14 | 1.48032 | 1.48273 | 1.48677 |
| 14) | −183.91 | 2.27 | 1 |  |  |
| 15) | −819.71 | −2.27 | −1 |  |  |
| 16) | −183.91 | −23.14 | −1.48032 | −1.48273 | −1.48677 |
| 17) | −244.53 | −20.72 | −1 |  |  |
| 18) | 290.56 | −9.44 | −1.46671 | −1.46964 | −1.47456 |
| 19) | −603.37 | −100.05 | −1 |  |  |
| 20) | −706.41 | −10.83 | −1.46671 | −1.46964 | −1.47456 |
| 21) | −324.77 | −2.97 | −1 |  |  |
| 22) | −347.21 | −40.61 | −1.48032 | −1.48273 | −1.48677 |
| 23) | 308.91 | −166.40 | −1 |  |  |
| 24) | ∞ | 228.00 | 1 |  |  |
| 25) | ∞ | −306.33 | −1 |  |  |
| 26) | −478.14 | −18.14 | −1.59415 | −1.60086 | −1.61279 |
| 27) | −264.60 | −49.69 | −1 |  |  |
| 28) | −269.33 | −53.60 | −1.59415 | −1.60086 | −1.61279 |
| 29) | −351.63 | −11.78 | −1 |  |  |
| 30) | −607.19 | −34.98 | −1.48032 | −1.48273 | −1.48677 |
| 31) | 1050.05 | −95.25 | −1 |  |  |

Figure 12:
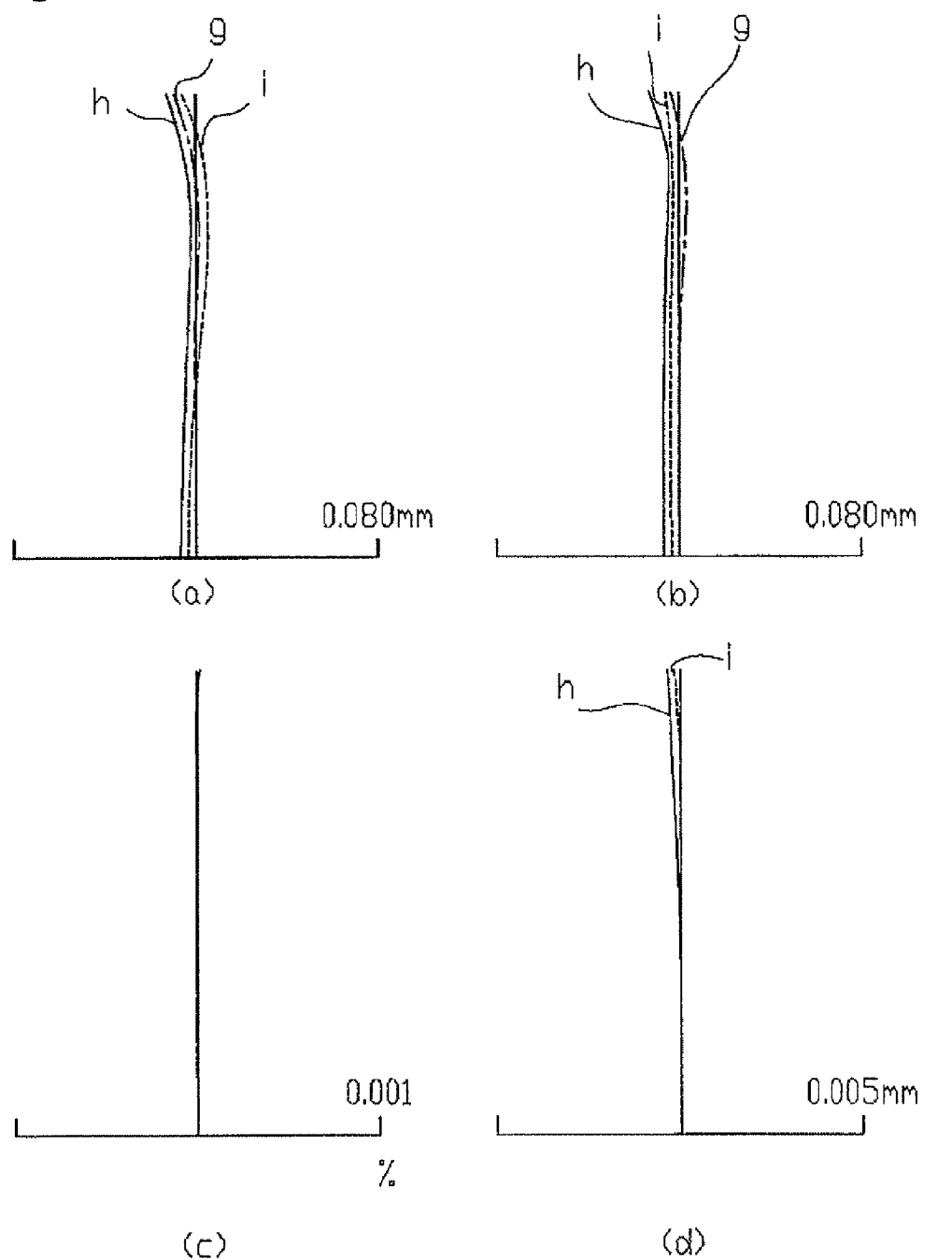
FIG. 12 is an aberration diagram of the projection optical system according to the first example.
Figure 13:
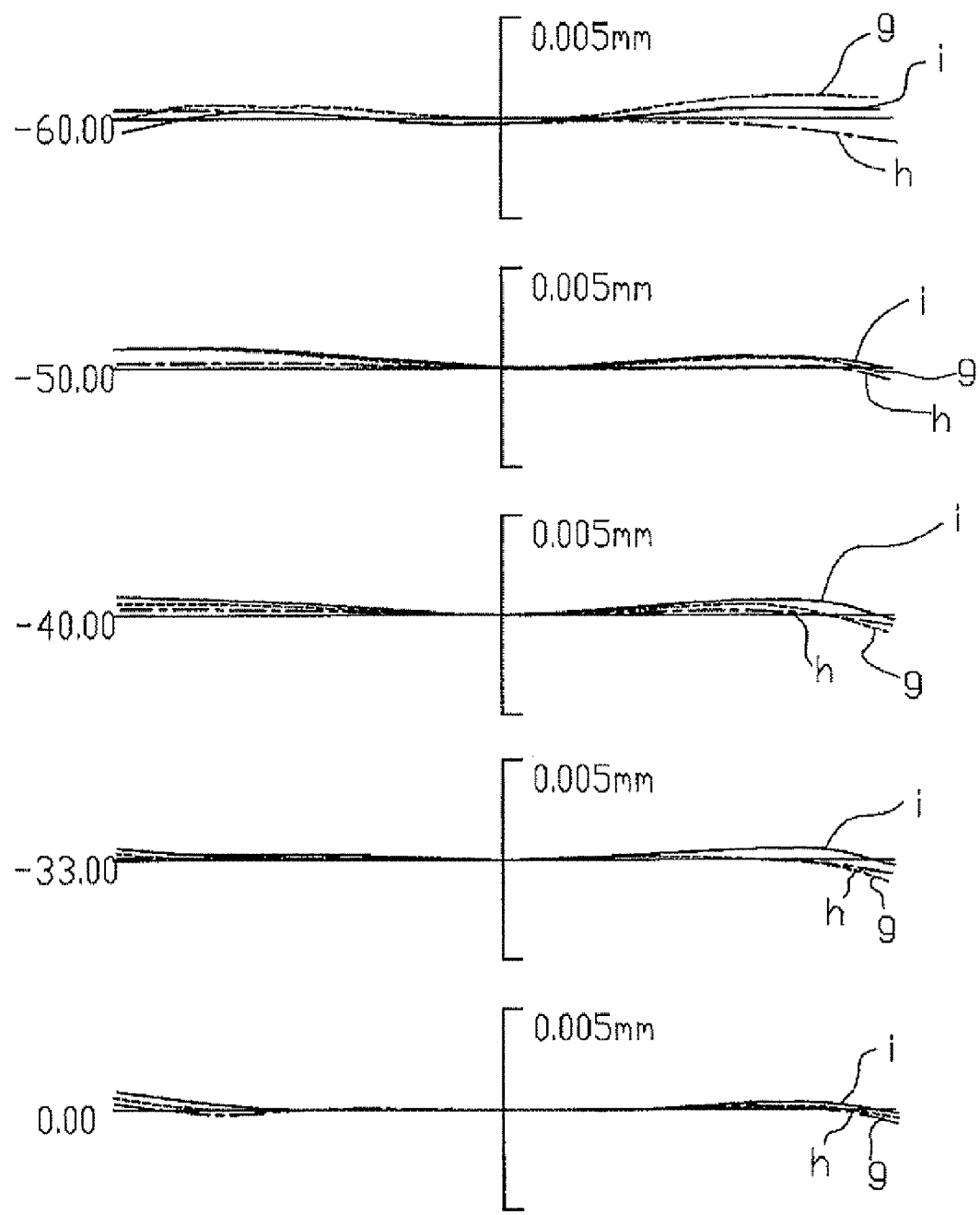
FIG. 13 is an aberration diagram of the projection optical system according to the first example.

FIGS. 12 and 13 show aberration diagrams of the catadioptric system PL10. In FIG. 12 (a) indicates spherical aberration, (b) curvature of field, (c) distortion, and (d) chromatic aberration of magnification and FIG. 13 shows ray aberrations. As shown in these figures, the catadioptric system PL20 is compensated well for the aberrations.

Example 2

Figure 14:
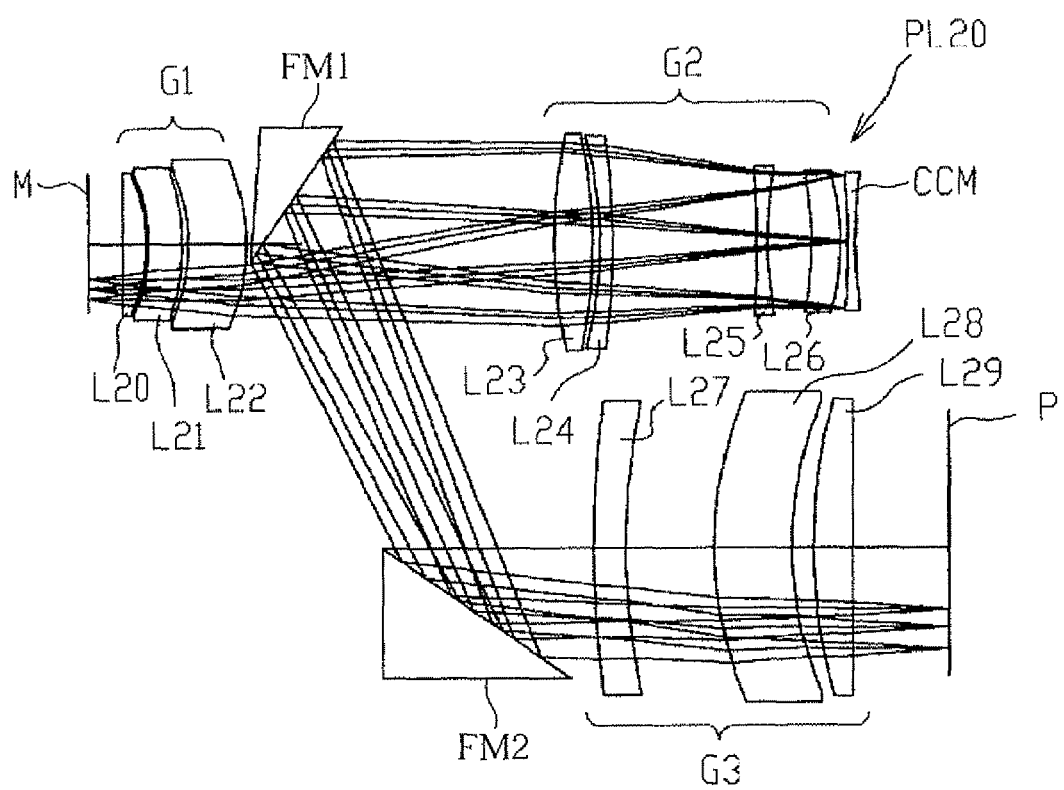
FIG. 14 is a drawing showing a configuration of a projection optical system according to the second example.

As shown in FIG. 14, the catadioptric system PL20 has a concave reflecting mirror CCM, a first lens unit G1, a second lens unit G2, a third lens unit G3, a first deflecting member FM1, and a second deflecting member FM2.

The first lens unit G1 is composed of a positive meniscus lens L20 with a concave surface on the mask M side, a negative meniscus lens L21 with a concave surface on the mask M side, and a negative meniscus lens L22 with a concave surface on the mask M side. The second lens unit G2 is composed of a biconvex lens L23, a negative meniscus lens L24 with a concave surface on the mask M side, a biconcave lens L25, and a positive meniscus lens L26 with a concave surface on the mask M side. The third lens unit G3 is composed of a negative meniscus lens L27 with a concave surface on the plate P side, a negative meniscus lens L28 with a concave surface on the plate P side, and a biconvex lens L29.

The below presents values of the specifications of the catadioptric system PL20 in Example 2.

(Specifications)
Projection magnification: 2.0
Image-side NA: 0.069
Object-side NA: 0.138
Image field: φ240 mm
Field of view: φ120 mm
Value corresponding to the condition: f3/f1=1321/642=2.06
(Table 2)
(Specifications of Optical Members)

TABLE 2

| men | r | d | n(g) | n(h) | n(i) |
|---|---|---|---|---|---|
| 0) |  | 33.20 | 1 |  |  |
| 1) | −4051.57 | 21.75 | 1.48032 | 1.48273 | 1.48677 |
| 2) | −175.17 | 2.28 | 1 |  |  |
| 3) | −174.54 | 29.84 | 1.59415 | 1.60086 | 1.61279 |
| 4) | −240.70 | 4.50 | 1 |  |  |
| 5) | −191.97 | 55.18 | 1.48032 | 1.48273 | 1.48677 |
| 6) | −212.24 | 281.83 | 1 |  |  |
| 7) | 417.42 | 35.13 | 1.48032 | 1.48273 | 1.48677 |
| 8) | −551.98 | 4.15 | 1 |  |  |
| 9) | −483.59 | 13.52 | 1.46671 | 1.46964 | 1.47456 |
| 10) | −828.34 | 133.62 | 1 |  |  |
| 11) | −777.77 | 9.27 | 1.46671 | 1.46964 | 1.47456 |
| 12) | 399.46 | 40.42 | 1 |  |  |
| 13) | −331.21 | 25.93 | 1.48032 | 1.48273 | 1.48677 |
| 14) | −250.69 | 5.80 | 1 |  |  |
| 15) | −1052.13 | −5.80 | −1 |  |  |
| 16) | −250.69 | −25.93 | −1.48032 | −1.48273 | −1.48677 |
| 17) | −331.21 | −40.42 | −1 |  |  |
| 18) | 399.46 | −9.27 | −1.46671 | −1.46964 | −1.47456 |
| 19) | −777.77 | −133.62 | −1 |  |  |
| 20) | −828.34 | −13.52 | −1.46671 | −1.46964 | −1.47456 |
| 21) | −483.59 | −4.15 | −1 |  |  |
| 22) | −551.98 | −35.13 | −1.48032 | −1.48273 | −1.48677 |
| 23) | 417.42 | −270.00 | −1 |  |  |
| 24) | ∞ | 290.00 | 1 |  |  |
| 25) | ∞ | −204.04 | −1 |  |  |
| 26) | −854.96 | −30.05 | −1.59415 | −1.60086 | −1.61279 |
| 27) | −535.59 | −82.36 | −1 |  |  |
| 28) | −332.43 | −70.04 | −1.59415 | −1.60086 | −1.61279 |
| 29) | −321.50 | −18.77 | −1 |  |  |
| 30) | −440.56 | −36.04 | −1.48032 | −1.48273 | −1.48677 |
| 31) | 8692.01 | −85.64 | −1 |  |  |

Figure 15:
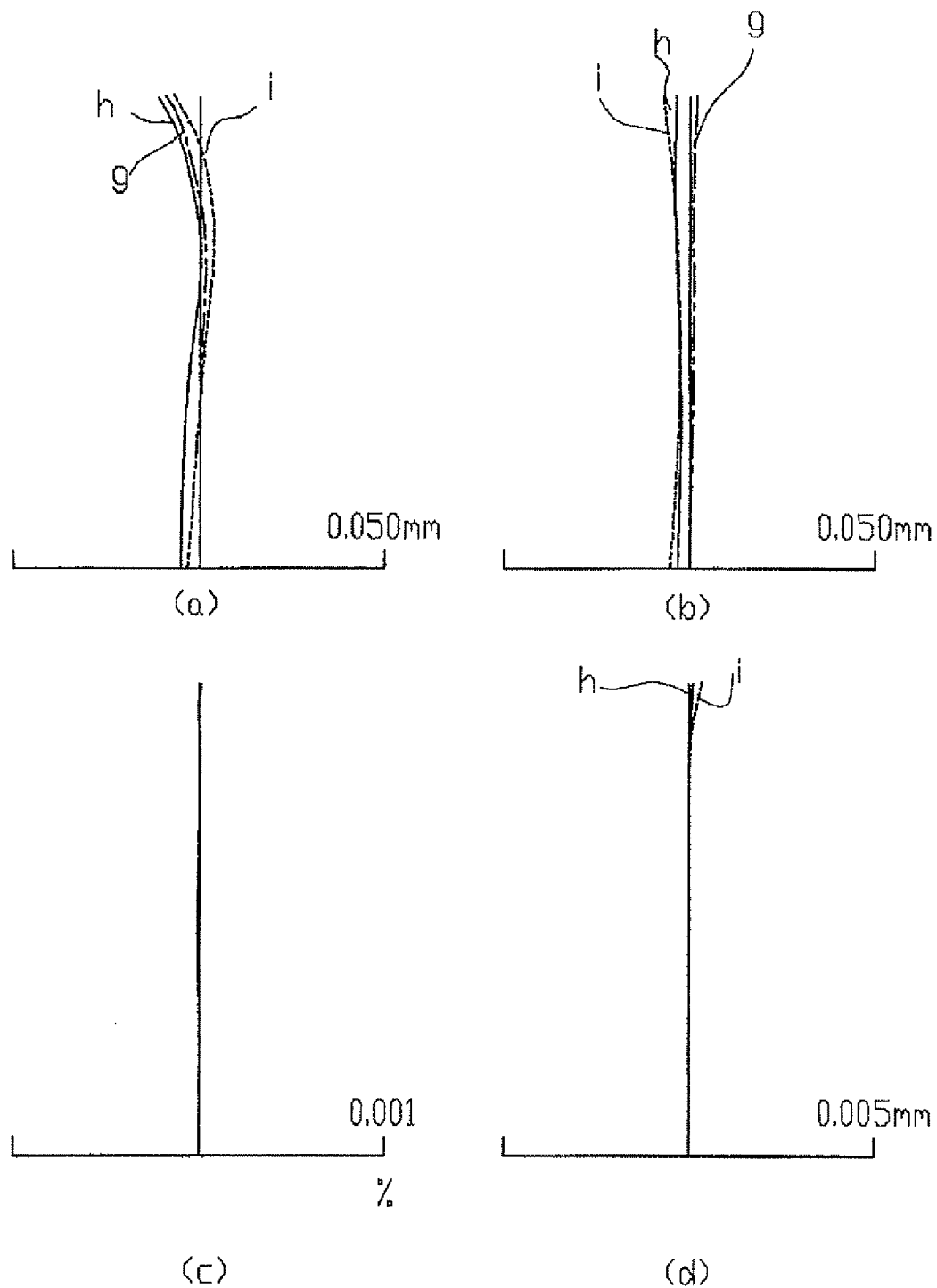
FIG. 15 is an aberration diagram of the projection optical system according to the second example.
Figure 16:
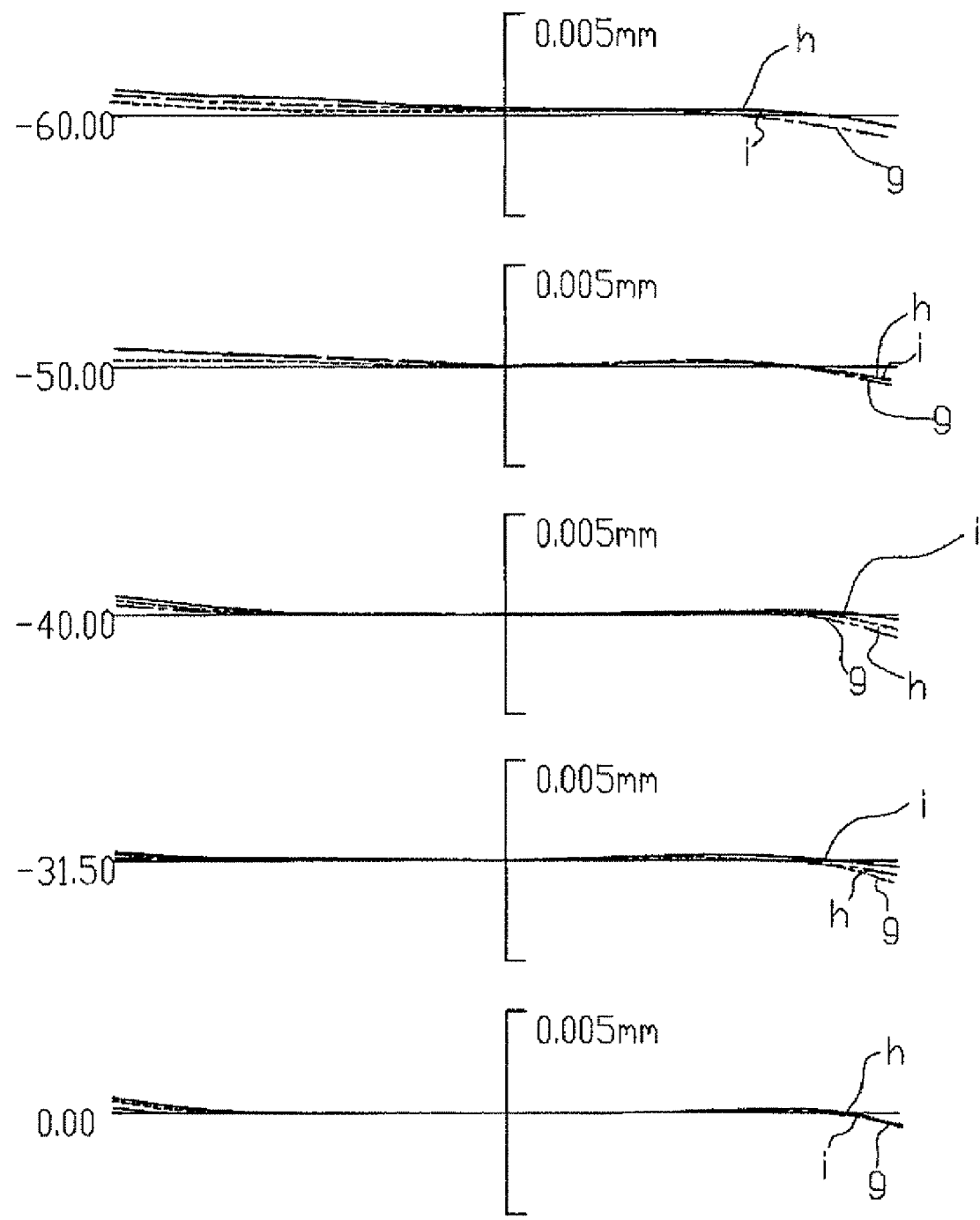
FIG. 16 is an aberration diagram of the projection optical system according to the second example.

FIGS. 15 and 16 show aberration diagrams of the catadioptric system PL20. In FIG. 15 (a) indicates spherical aberration, (b) curvature of field, (c) distortion, and (d) chromatic aberration of magnification and FIG. 16 shows ray aberrations. As shown in these figures, the catadioptric system PL20 is compensated well for the aberrations.

It should be noted that the embodiments described above were described for easier understanding of the present invention but not described to restrict the present invention. Therefore, each of the elements disclosed in the embodiments is intended to embrace all design changes and equivalents belonging to the technical scope of the present invention.

The disclosure in the present specification is associated with the subject matter included in Japanese Patent Application No. 2006-76011 filed on Mar. 20, 2006 and Japanese Patent Application No. 2007-6655 filed on Jan. 16, 2007, and the disclosure of the Japanese patent applications are explicitly incorporated herein by reference in its entirety.

INDUSTRIAL APPLICABILITY

The present invention is suitably applicable to the catadioptric projection optical systems and catadioptric optical apparatus for projecting the image of the mask, reticle, or the like onto the substrate or the like, the scanning exposure apparatus for projecting the image of the first object onto the second object to effect exposure thereof, and the microdevice manufacturing method using the scanning exposure apparatus.

The invention claimed is:

1. A scanning exposure apparatus which transfers a pattern of a first object onto a second object while projecting an image of the first object placed on a first plane, onto the second object placed on a second plane and changing a positional relation between the image of the first object and the second object in a scanning direction, the scanning exposure apparatus comprising:

a first projection optical system having a first field of view on the first plane and adapted to project an enlargement image of a portion of the first object in a first projection region on the second plane, based on light from the first field of view; and a second projection optical system having a second field of view on the first plane and adapted to project an enlargement image of a portion of the first object in a second projection region on the second plane, based on light from the second field of view;

wherein the first projection optical system and the second projection optical system are arranged at intervals with reference to the scanning direction;

wherein the first projection optical system comprises a first beam shifter for shifting the light from the first field of view in a first direction substantially parallel to the scanning direction, and guiding the light to the first projection region located as shifted relative to the first field of view in the first direction with reference to a direction along the first plane; and wherein the second projection optical system comprises a second beam shifter for shifting light from the second field of view in a second direction opposite to the first direction, and guiding the light to the second projection region located as shifted relative to the second field of view in the second direction with reference to a direction along the first plane;

the scanning exposure apparatus satisfying the following relation:

$$DP = |\beta| \times Dm,$$

where Dm is a first interval being an interval along the scanning direction on the first plane between the first field of view and the second field of view, Dp is a second interval being an interval along the scanning direction on the second plane between the first projection region and the second projection region, and $\beta$ is a magnification of the first and second projection optical systems.

2. The scanning exposure apparatus according to claim 1, wherein the magnification in the first direction of the first projection optical system and the magnification in the second direction of the second projection optical system are over +1.

3. The scanning exposure apparatus according to claim 1, wherein the magnification of the first projection optical system in a third direction perpendicular to the first direction and the magnification of the second projection optical system in a fourth direction perpendicular to the second direction are below −1.

4. The scanning exposure apparatus according to claim 1, wherein a first line segment connecting the first field of view region and the first projection region along the first direction does not overlap with a second line segment connecting the second field of view region and the second projection region along the second direction when viewed from a direction perpendicular to the scanning direction.

5. The scanning exposure apparatus according to claim 1, wherein the first beam shifter and the second beam shifter make a traveling direction of the light incident to each beam shifter, parallel to a traveling direction of the light exiting from each beam shifter.

6. The scanning exposure apparatus according to claim 1, wherein each of the first beam shifter and the second beam shifter comprises a plurality of reflecting surfaces.

7. The scanning exposure apparatus according to claim 1, wherein the second object is a photosensitive substrate having an outside diameter larger than 500 mm.

8. A microdevice manufacturing method comprising:

exposing a pattern of a mask onto a photosensitive substrate, using the scanning exposure apparatus as set forth in claim 1; and developing the photosensitive substrate on which the pattern of the mask is exposed.

9. A scanning exposure apparatus which transfers a pattern of a first object onto a second object while projecting an image of the first object placed on a first plane, onto the second object placed on a second plane and changing a positional relation between the image of the first object and the second object in a scanning direction, the scanning exposure apparatus comprising:

a first row of projection optical systems comprising a plurality of first projection optical systems each having a first field of view on the first plane and on a first row along a non-scanning direction being a direction crossing the scanning direction, the first projection optical system having a first beam shifter which shifts light from the first field of view in a first direction substantially parallel to the scanning direction and guides the light from the first field of view to a first projection region located, as shifted relative to the first field of view in the first direction with reference to a direction along the first plane; and a second row of projection optical systems comprising a plurality of second projection optical systems each having a second field of view on the second plane and on a second row being a row along the non-scanning direction and different from the first row, the second projection optical system having a second beam shifter which shifts light from the second field of view in a second direction opposite to the first direction and guides the light from the second field of view to a second projection region located, as shifted relative to the second field of view in the second direction with reference to a direction along the first plane;

wherein the first row of projection optical systems form a plurality of projection regions conjugate with the plurality of field of views of the first row of projection optical systems, on a third row on the second plane; and wherein the second row of projection optical systems form a plurality of projection regions conjugate with the plurality of field of views of the second row of projection optical systems, on a fourth row on the second plane;

the scanning exposure apparatus satisfying the following relation:

$$Dp=|\beta|\times Dm,$$

where Dm is a first interval being an interval along the scanning direction on the first plane between the first row and the second row, Dp is a second interval being an interval along the scanning direction on the second plane between the third row and the fourth row, and β is a magnification of the first and second projection optical systems.

10. A catadioptric projection optical system which forms an image of a first object placed on a first plane, at a projection magnification with an enlargement on a second object placed on a second plane, the projection optical system comprising:

a concave reflecting mirror disposed in an optical path between the first plane and the second plane;

a first lens unit disposed in an optical path between the first plane and the concave reflecting mirror;

a second lens unit disposed in an optical path between the first lens unit and the concave reflecting mirror, the second lens unit having an optical axis substantially parallel to an optical axis of the first lens unit;

a first deflecting member disposed in an optical path between the second lens unit and the second plane and adapted to deflect light so as to traverse the optical axis of the first lens unit;

a second deflecting member disposed in an optical path between the first deflecting member and the second plane; and a third lens unit disposed in an optical path between the second deflecting member and the second plane and having an optical axis substantially parallel to the optical axis of the first lens unit, wherein the first deflecting member deflects light from the concave reflecting mirror in a first direction substantially parallel to the first plane; and wherein the second deflecting member deflects the light from the first deflecting member in a direction substantially parallel to the optical axis of the first lens unit.

11. The catadioptric projection optical system according to claim 10, wherein a distance between the first plane and the second plane is larger than a distance between the first plane and the concave reflecting mirror.

12. The catadioptric projection optical system according to claim 10, wherein every optical member with a refracting power forming the first lens unit, the second lens unit, and the third lens unit is arranged so that an optical axis thereof is parallel to a direction of gravity.

13. The catadioptric projection optical system according to claim 10, further comprising:

an aperture stop for determining a numerical aperture on the second plane side of the catadioptric projection optical system, which is disposed in an optical path between the concave reflecting mirror and the second lens unit, wherein the aperture stop is positioned so that the projection optical system becomes substantially telecentric on the first plane side and on the second plane side.

14. The catadioptric projection optical system according to claim 10, which satisfies the following relations:

$$0.8\times|\beta|\leq f3/f1 \leq 1.25\times|\beta|, \text{ and}$$

$$|\beta|\geq 1.8,$$

where f1 is a focal length of the first lens unit, f3 is a focal length of the third lens unit, and β is a magnification of the projection optical system.

15. The catadioptric projection optical system according to claim 10, the catadioptric projection optical system comprising an optical property adjusting mechanism.

16. The catadioptric projection optical system according to claim 15, wherein the optical property adjusting mechanism is disposed in an optical path between the concave reflecting mirror and the second plane.

17. The catadioptric projection optical system according to claim 10, the catadioptric projection optical system forming a primary image of the first object on the second plane.

18. A catadioptric optical apparatus comprising a first imaging optical system for forming an intermediate image of the first plane, and a second imaging optical system for making the intermediate image optically conjugate with the second plane, wherein at least one of the first imaging optical system and the second imaging optical system is comprised of the catadioptric projection optical system as set forth in claim 10.

19. A scanning exposure apparatus which transfers a pattern of a first object onto a second object while changing a positional relation of the first object and the second object with a projection apparatus for projecting an image of the first object placed on a first plane, onto the second object placed on a second plane, in a scanning direction, wherein the projection apparatus comprises a first projection optical apparatus positioned at a first position in the scanning direction, and a second projection optical apparatus positioned at a second position different from the first position in the scanning direction; and wherein the first and second projection optical apparatus comprise the catadioptric optical apparatus as set forth in claim 18.

20. A scanning exposure apparatus which transfers a pattern of a first object onto a second object while changing a positional relation of the first object and the second object with a projection apparatus for projecting an image of the first object placed on a first plane, onto the second object placed on a second plane, in a scanning direction, wherein the projection apparatus comprises a first projection optical apparatus positioned at a first position in the scanning direction, and a second projection optical apparatus positioned at a second position different from the first position in the scanning direction;

wherein the first and second projection optical apparatus comprise the catadioptric projection optical system as set forth in claim 10.

21. The scanning exposure apparatus according to claim 20, wherein the first and second projection optical apparatus are arranged so that an interval on the second object side between the first and second projection optical apparatus is larger than an interval on the first object side.

* * * * *